US007763364B2

(12) United States Patent
Nishita

(10) Patent No.: US 7,763,364 B2
(45) Date of Patent: Jul. 27, 2010

(54) ORGANIC ELECTROLUMINESCENCE DEVICE

(75) Inventor: Nobuhiro Nishita, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 871 days.

(21) Appl. No.: 11/633,554

(22) Filed: Dec. 5, 2006

(65) Prior Publication Data

US 2007/0172700 A1 Jul. 26, 2007

(30) Foreign Application Priority Data

Jan. 23, 2006 (JP) ............................ 2006-014296

(51) Int. Cl.
*B32B 7/00* (2006.01)
*B32B 33/00* (2006.01)
*H01J 1/62* (2006.01)
*H01L 33/26* (2010.01)

(52) U.S. Cl. ...................... 428/690; 257/103; 313/506; 428/917

(58) Field of Classification Search ................ 428/690; 313/503, 506

See application file for complete search history.

(56) References Cited

U.S. PATENT DOCUMENTS

2002/0105005 A1* 8/2002 Seo et al. .................... 257/101
2003/0146443 A1* 8/2003 Yamazaki et al. ............. 257/80
2003/0218418 A9* 11/2003 Sato et al. .................. 313/504

FOREIGN PATENT DOCUMENTS

JP 2003-123984 A 4/2003
JP 2003-229279 A 8/2003

* cited by examiner

*Primary Examiner*—Robert Sellers
(74) *Attorney, Agent, or Firm*—Birch, Stewart, Kolasch & Birch, LLP

(57) ABSTRACT

An organic electroluminescence device including at least a light-emitting layer between a pair of electrodes and a hole transport layer between the light-emitting layer and an anode of the pair of electrodes, wherein the device further includes a mixture layer of an electron transporting material and a hole transporting material, the mixture layer being disposed between the light-emitting layer and the hole transport layer and in direct contact with the light-emitting layer. An organic electroluminescence device having high light emitting efficiency and high driving durability is provided.

11 Claims, No Drawings

ORGANIC ELECTROLUMINESCENCE DEVICE

CROSS-REFERENCE TO RELATED APPLICATION

This application claims priority under 35 USC 119 from Japanese Patent Application No. 2006-14,296, the disclosure of which is incorporated by reference herein.

BACKGROUND OF THE INVENTION

1. Field of the Invention

The present invention relates to an organic electroluminescence device (hereinafter, referred to as an "organic EL device" in some cases) which can be effectively applied to a surface light source for full color display, backlight, illumination light sources and the like, or to a light source array for printers, and the like.

2. Description of the Related Art

An organic EL device is composed of a light-emitting layer or a plurality of organic layers including a light-emitting layer, and a pair of electrodes sandwiching the organic layers. An organic EL device is a device for obtaining luminescence by utilizing at least either of luminescence from excitons each of which is obtained by recombining an electron injected from a cathode with a positive hole injected from an anode to produce the exciton, or luminescence from excitons of other molecules produced by energy transmission from the above-described excitons.

Heretofore, an organic EL device has been developed by using a laminate structure from integrated layers in which each layer is functionally differentiated, whereby brightness and device efficiency have been remarkably improved. For example, it is described in "Science", vol. 267, No. 3, page 1332, 1995 that a two-layer laminated type device obtained by laminating a positive hole transport layer and a light-emitting layer also functioning as an electron transport layer; a three-layer laminated type device obtained by laminating a positive hole transport layer, a light-emitting layer, and an electron transport layer; and a four-layer laminated type device obtained by laminating a positive hole transport layer, a light-emitting layer, a positive hole-blocking layer, and an electron transport layer have been frequently used.

However, many problems still remain for putting organic EL devices to practical use. First, there is a need to attain a high emitting efficiency, and second, there is a need to attain high driving durability. Particularly, deterioration in quality when these devices are continuously driven is an important problem.

For example, Japanese Patent Application Laid-Open (JP-A) No. 2003-123984 proposes an attempt to dispose an electron transport layer containing two or more blended electron transporting materials between a light-emitting layer and a cathode to thereby maintain electron transport ability and to increase the thickness of the device to thereby reduce trouble such as short circuits while maintaining emitting efficiency. However, these measures fail to improve the mobility of holes, and therefore, the problem of accumulation and deterioration of holes in the vicinity of the boundary between the light-emitting layer and the electron transport layer and the problem of a deterioration from the cationic state of the electron transporting material due to holes which leak from the boundary are left unsolved, arousing concern regarding the problem that driving durability is deteriorated.

Further, JP-A No. 2003-229279 discloses an attempt to reduce deterioration of an electron transporting material by mixing a hole-trapping material in an electron transport layer disposed between a light-emitting layer and a cathode to trap holes which leak from the light-emitting layer. However, although the deterioration of the electron transporting material is reduced by this measure, the mobility of electrons and the mobility of holes are deteriorated, so that the light-emitting efficiency is not improved, and therefore, the deterioration in driving durability caused by the accumulation and deterioration of holes in the vicinity of the boundary between the light-emitting layer and the electron transport layer cannot be sufficiently reduced.

It is a very important problem and a problem that always needs improvement, to attain high emitting efficiency and high driving durability at the same time in designing a practically useful luminescence device.

SUMMARY OF THE INVENTION

The present invention has been made in view of the above circumstances and provides an organic electroluminescence device comprising at least a light-emitting layer between a pair of electrodes and a hole transport layer between the light-emitting layer and an anode of the pair of electrodes, wherein the device further comprises a mixture layer of an electron transporting material and a hole transporting material, and the mixture layer is disposed between the light-emitting layer and the hole transport layer and in direct contact with the light-emitting layer.

DETAILED DESCRIPTION OF THE INVENTION

It is an object of the present invention to provide organic electroluminescence device having high emitting efficiency and high driving durability.

An organic electroluminescence device in the present invention comprises at least a light-emitting layer between a pair of electrodes and a hole transport layer between the light-emitting layer and an anode of the pair of electrodes, wherein the device further comprises a mixture layer of an electron transporting material and a hole transporting material, and the mixture layer is disposed between the light-emitting layer and the hole transport layer and in direct contact with the light-emitting layer.

Preferably, the electron transporting material contained in the mixture layer is a metal complex. More preferably, the metal complex is a compound represented by the following formula (1).

Formula (1)

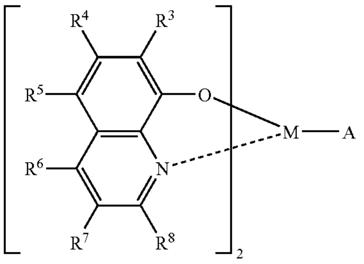

In formula (1), M represents Al, Ga or In, $R_3$ to $R_8$ each independently represent a hydrogen atom, an alkyl group or an alkoxy group, and A represents —O-Ar in which Ar is an aryl group or a halogen atom.

Preferably, the electron transporting material contained in the mixture layer has an electron mobility of $10^{-5}$ $cm^2/V \cdot s$ or more.

Preferably, the mixture layer has a thickness in a range from 0.1 nm to 20 nm.

Various means are known for promoting the injection of electrons into a light-emitting layer to improve luminance. For example, doping an electron transport layer with an electron-donating dopant to thereby promote the injection of electrons into the electron transport layer from a cathode and interposing an electron transporting intermediate layer comprising an electron transport host between the electron transport layer and the light-emitting layer to promote the injection of electrons into the light-emitting layer are known. However, these electron injection promoting means have not necessarily resulted in improvements in emitting efficiency and luminance to the degree expected. The inventors of the present invention have analyzed the reason thesefor and, as a result, found that these electron injection promoting means all give rise to the concentration and residence of electrons in the vicinity of the anode side boundary of the light-emitting layer, which resultantly becomes a cause of a reduction in emitting efficiency and in driving durability.

The inventors of the present invention have earnestly researched means of improvement and, as a result, found that a structure in which a hole transport layer is disposed between a light-emitting layer and an anode, and in which a mixture layer of an electron transporting material and a hole transporting material is disposed between the light-emitting layer and the hole transport layer makes it less likely for the concentration of electrons at the boundary to occur and suppresses the deterioration.

In the following, the organic electroluminescence device of the present invention will be described in detail.

(Constitution)

The organic electroluminescence device in the present invention has at least an organic compound layer containing a light-emitting layer in between a pair of electrodes (anode and cathode), a positive hole transport layer between the anode and the light-emitting layer, and a mixture layer of an electron transporting material and a hole transporting material between the light-emitting layer and the hole transport layer.

In view of the property of an electroluminescence device, it is preferred that at least either electrode of the pair of electrodes is transparent.

As a lamination pattern of the organic compound layers in the present invention, it is preferred that the layers are laminated in the order of a positive hole transport layer, a mixture layer of an electron transporting material and a hole transporting material, a light-emitting layer, and electron transport layer from the anode side. Moreover, a positive hole-transporting intermediate layer between the positive hole transport layer and the light-emitting layer and/or an electron transporting intermediate layer between the light-emitting layer and the electron transport layer are provided. Besides, a positive hole injection layer may be provided in between the anode and the positive hole transport layer as well as an electron injection layer may be provided in between the cathode and the electron transport layer.

The preferred modes of the organic compound layer in the organic electroluminescence device of the present invention are as follows. (1) An embodiment having a positive hole-injection layer, a positive hole transport layer (the positive hole-injection layer may also has a role of the positive hole transport layer), a positive hole transporting intermediate layer, a mixture layer of an electron transporting material and a hole transporting material, a light-emitting layer, an electron transport layer, and an electron injection layer (the electron transport layer may also has a role of the electron injection layer) in this order from the anode side; (2) an embodiment having positive hole-injection layer, a positive hole transport layer (the positive hole-injection layer may also has a role of the positive hole transport layer), a mixture layer of an electron transporting material and a hole transporting material, a light-emitting layer, an electron transporting immediate layer, an electron transport layer, and an electron injection layer (the electron transport layer may also has a role of the electron injection layer); and (3) an embodiment having a positive hole-injection layer, a positive hole transport layer (the positive hole-injection layer may also has a role of the positive hole transport layer), a positive hole transporting intermediate layer, a mixture layer of an electron transporting material and a hole transporting material, a light-emitting layer, an electron transporting intermediate layer, an electron transport layer, and an electron injection layer (the electron transport layer may also has a role of the electron injection layer).

The above-described positive hole transporting intermediate layer has preferably at least either a function for accelerating the injection of positive holes into the light-emitting layer, or a function for blocking electrons.

The above-described mixture layer of an electron transporting material and a hole transporting material has preferably at least either a function for preventing the concentration and residence of electrons in the vicinity of the anode side boundary of the light-emitting layer.

Furthermore, the above-described electron transporting intermediate layer has preferably at least either a function for accelerating the injection of electrons into the light-emitting layer, or a function for blocking positive holes.

Moreover, at least either of the above-described positive hole transporting intermediate layer and the electron transporting intermediate layer has preferably a function for blocking excitons produced in the light-emitting layer.

In order to express effectively the functions for accelerating the injection of positive holes, or the injection of electrons, and the functions for blocking positive holes, electrons, or excitons, it is preferred that the positive hole transporting intermediate layer and the electron transporting intermediate layer are adjacent to the light-emitting layer.

The respective layers mentioned above may be separated into a plurality of secondary layers.

Next, the components constituting the electroluminescence of the present invention will be described in detail.

An organic compound layer in the present invention is described.

The organic electroluminescence device of the present invention has an organic compound layer containing at least one layer of a light-emitting layer. Examples of the organic compound layers other than the light-emitting layer include, as mentioned above, respective layers of a positive hole-injection layer, a positive hole transport layer, a mixture layer of an electron transporting material and a hole transporting material, an electron transporting intermediate layer, an electron transport layer, an electron injection layer and the like layers.

(Formation of Organic Compound Layer)

In the organic electroluminescence device of the present invention, the respective layers constituting the organic compound layers can be suitably formed in accordance with any of a dry film-forming method such as a vapor deposition method, or a sputtering method; a transfer method; a printing method; a coating method; an ink-jet printing method; or a spray method.

(Positive Hole-Injection Layer and Positive Hole-Transport Layer)

The positive hole-injection layer and positive hole-transport layer correspond to layers functioning to receive positive holes from an anode or from an anode side and to transport the positive holes to a cathode side.

As an electron-accepting dopant to be introduced into a positive hole-injection layer or a positive hole-transport layer, either of an inorganic compound or an organic compound may be used as long as the compound has electron accepting property and a function for oxidizing an organic compound. Specifically, Lewis acid compounds such as ferric chloride, aluminum chloride, gallium chloride, indium chloride, and antimony pentachloride are preferably used as the inorganic compounds.

In case of the organic compounds, compounds having substituents such as a nitro group, a halogen, a cyano group, or a trifluoromethyl group; quinone compounds, acid anhydride compounds, and fullerenes may be preferably applied.

Specific examples of the organic compounds include hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, tetramethylbenzoquinone, 1,2,4,5-tetracyanobenzene, o-dicyanobenzene, p-dicyanobenzene, 1,4-dicyanotetrafluorobenzene, 2,3-dichloro-5,6-dicyanobenzoquinone, p-dinitrobenzene, m-dinitrobenzene, o-dinitrobenzene, p-cyanonitrobenzene, m-cyanonitrobenzene, o-cyanonitrobenzene, 1,4-naphthoquinone, 2,3-dichloronaphthoquinone, 1-nitronaphthalene, 2-nitronaphthalene, 1,3-dinitronaphthalene, 1,5-dinitronaphthalene, 9-cyanoanthoracene, 9-nitroanthracene, 9,10-anthraquinone, 1,3,6,8-tetranitrocarbazole, 2,4,7-trinitro-9-fluorenone, 2,3,5,6-tetracyanopyridine, maleic anhydride, phthalic anhydride, fullerene C60, and fullerene C70.

Among these, hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine, or fullerene C60 is preferable. Hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, or 2,3,5,6-tetracyanopyridine is particularly preferred.

These electron-accepting dopants may be used alone or in a combination of two or more of them.

Although an applied amount of these electron-accepting dopants depends on the type of material, 0.01% by mass to 50% by mass of a dopant is preferred with respect to a positive hole-transport layer material, 0.05% by mass to 20% by mass is more preferable, and 0.1% by mass to 10% by mass is particularly preferred. When the amount applied is less than 0.01% by mass with respect to the positive hole transportation material, it is not desirable because the advantageous effects of the present invention are insufficient, and when it exceeds 50% by mass, positive hole transportation ability is deteriorated, and thus, this is not preferred.

As a material for the positive hole-injection layer and the positive hole-transport layer, it is preferred to contain specifically pyrrole derivatives, carbazole derivatives, pyrazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted calcon derivatives, styrylanthracene derivatives, fluorenone derivatives, hydrazone derivatives, stilbene derivatives, silazane derivatives, aromatic tertiary amine compounds, styrylamine derivatives, aromatic dimethylidine compounds, porphyrin compounds, organosilane derivatives, carbon or the like.

Although a thickness of the positive hole-injection layer and the positive hole-transport layer is not particularly limited, it is preferred that the thickness is 1 nm to 5 μm, it is more preferably 5 nm to 1 μm, and 10 nm to 500 nm is particularly preferred in view of decrease in driving voltage, improvements in luminescent efficiency, and improvements in durability.

The positive hole-injection layer and the positive hole-transport layer may be composed of a monolayered structure comprising one or two or more of the above-mentioned materials, or a multilayer structure composed of plural layers of a homogeneous composition or heterogeneous compositions.

When the carrier transportation layer adjacent to the light-emitting layer is a positive hole-transport layer, it is preferred that the Ip (HTL) of the positive hole-transport layer is smaller than the Ip (D) of the dopant contained in the light-emitting layer in view of driving durability.

The Ip (HTL) in the positive hole-transport layer may be measured in accordance with the below-mentioned measuring method of Ip.

A carrier mobility in the positive hole-transport layer is usually from $10^{-7}$ $cm^2 \cdot V^{-1} \cdot s^{-1}$ to $10^1$ $cm^2 \cdot V^{-1} \cdot s^{-1}$; and in this range, from $10^{-5}$ $cm^2 \cdot V^{-1} \cdot s^{-1}$ to $10^{-1}$ $cm^2 \cdot V^{-1} \cdot s^{-1}$ is preferable; from $10^{-4}$ $cm^2 \cdot V^{-1} \cdot s^{-1}$ to $10^{-1}$ $cm^2 \cdot V^{-1} \cdot s^{-1}$ is more preferable; and from $10^{-3}$ $cm^2 \cdot V^{-1} \cdot s^{-1}$ to $10^{-1}$ $cm^2 \cdot V^{-1} \cdot s^{-1}$ is particularly preferable in view of the luminescent efficiency.

For the carrier mobility, a value measured in accordance with the same method as that of the carrier mobility of the above-described light-emitting layer is adopted.

Moreover, it is preferred that the carrier mobility in the positive hole-transport layer is higher than that in the above-described light-emitting layer in view of driving durability and luminescent efficiency.

(Mixture Layer of an Electron Transporting Material and a Hole Transporting Material)

The mixture layer of an electron transporting material and a hole transporting material in the present invention is a layer exhibiting a higher electron mobility than that of the adjacent organic layer and is a layer receiving electrons accumulated in the vicinity of the anode side boundary of the light-emitting layer to thereby prevent the accumulation of electrons in the vicinity of the boundary.

As the electron transporting material to be used in the mixture layer of the electron transporting material and hole transporting material in the present invention, conventionally known electron transporting materials may be used. The electron transporting material to be used in the present invention is preferably a compound selected from metal complexes, and more preferably a compound represented by the following formula (1).

Formula (1)

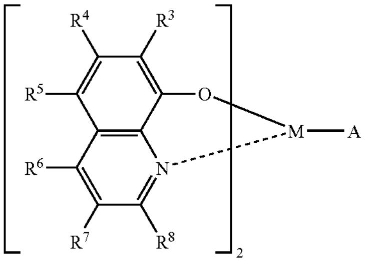

In the formula (1), M represents Al, Ga or In, $R_3$ to $R_8$ each represent a hydrogen atom, an alkyl group or an alkoxy group, and A represents —O-Ar in which Ar is an aryl group or a halogen atom.

The alkyl group preferably has 1 to 30 carbon atoms, more preferably 1 to 20 carbon atoms, and particularly preferably 1 to 10 carbon atoms. Examples of the alkyl group include methyl, ethyl, iso-propyl, tert-butyl, n-octyl, n-decyl, n-hexadecyl, cyclopropyl, cyclopentyl and cyclohexyl. The alkoxy group preferably has 1 to 30 carbon atoms, more preferably 1 to 20 carbon atoms, and particularly preferably 1 to 10 carbon atoms. Examples of the alkoxy group include methoxy, ethoxy, butoxy and 2-ethylhexyloxy. The aryl group preferably has 6 to 30 carbon atoms, more preferably 6 to 20 carbon atoms, and particularly preferably 6 to 12 carbon atoms. Examples of the aryl group include phenyl, p-methylphenyl, naphthyl and anthranyl. Examples of the halogen atom include a fluorine atom, a chlorine atom, a bromine atom and an iodine atom.

Specific examples of the compound represented by the above formula (1) will be described below.

(1)

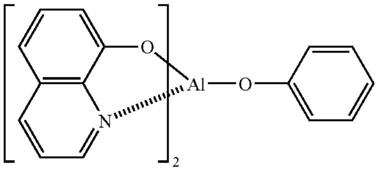

(2)

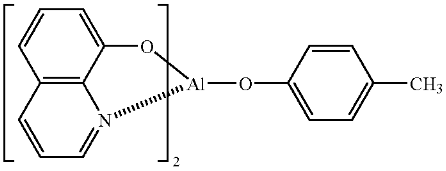

(3)

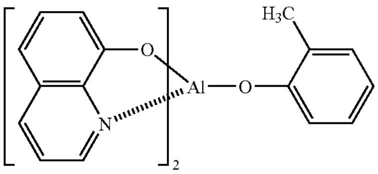

(4)

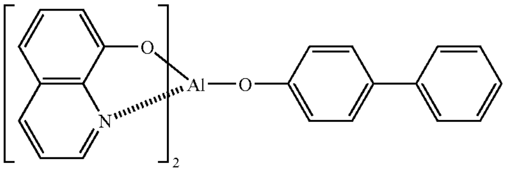

-continued (5)

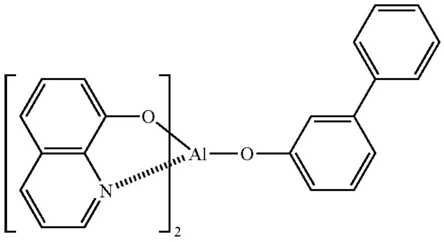

(6)

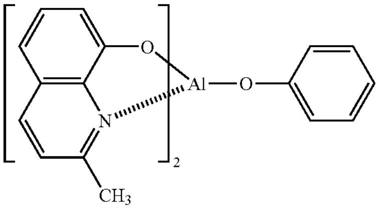

(7)

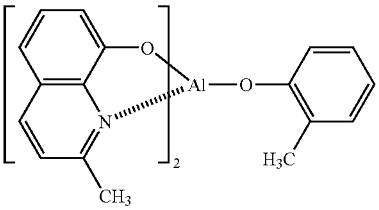

(8)

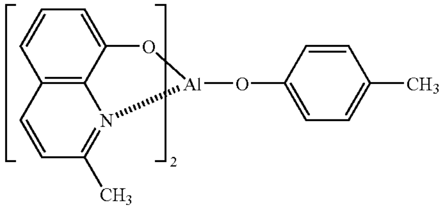

(9)

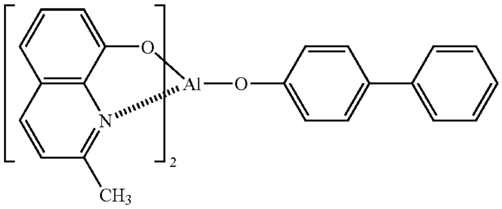

(10)

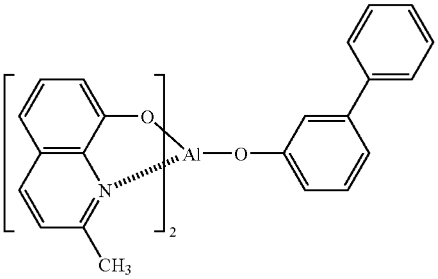

(11)

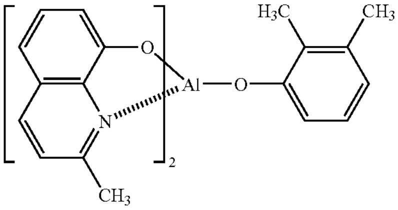

-continued
(12)
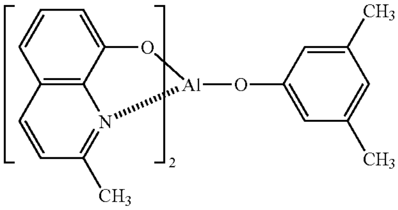
(13)
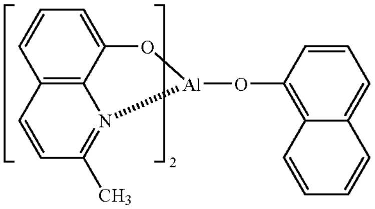
(14)
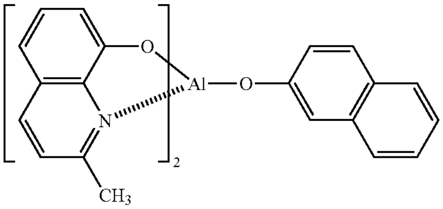
(15)
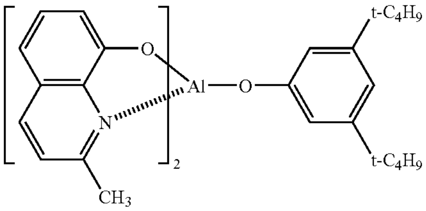
(16)
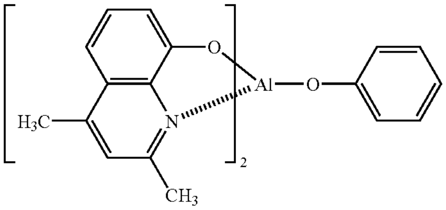
(17)
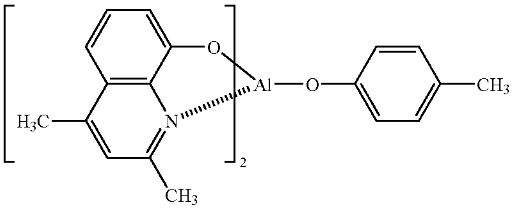
(18)
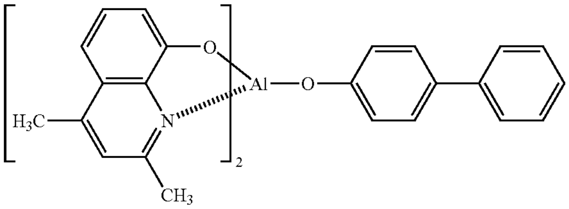
-continued
(19)
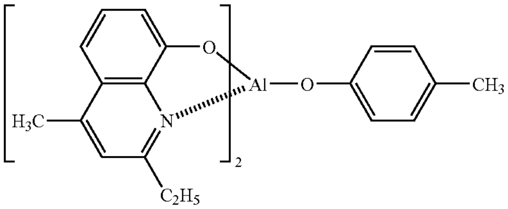
(20)
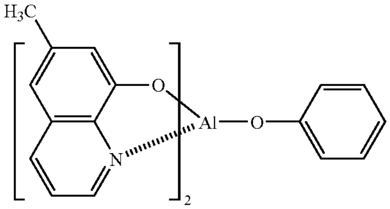
(21)
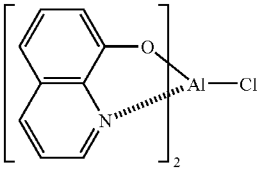
(22)
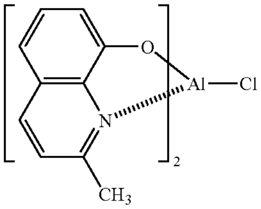
(23)
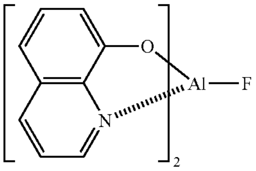
(24)
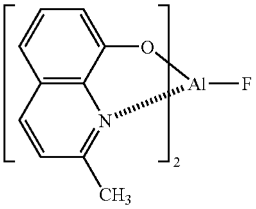
(25)
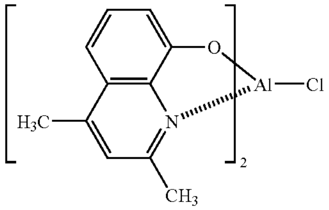

-continued
(26)
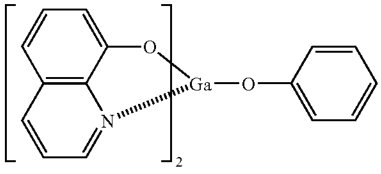
(27)
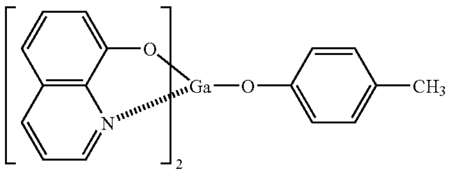
(28)
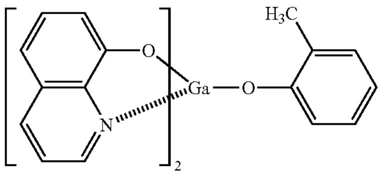
(29)
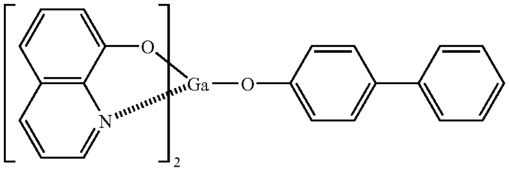
(30)
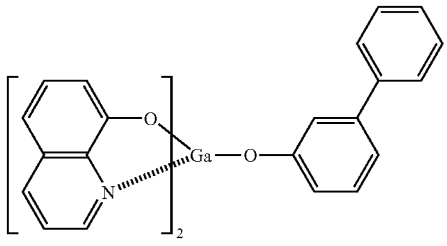
(31)
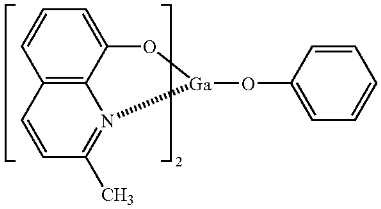
(32)
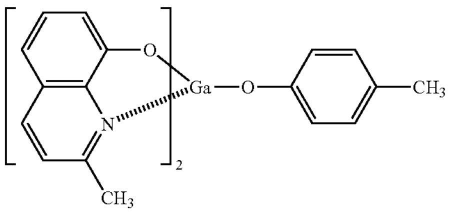
-continued
(33)
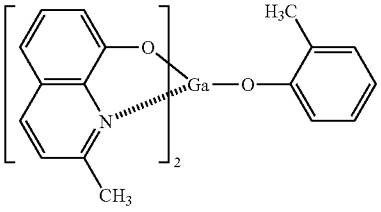
(34)
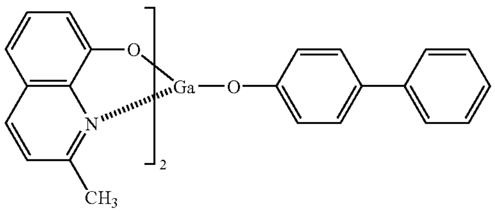
(35)
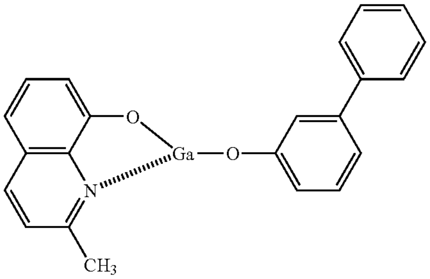
(36)
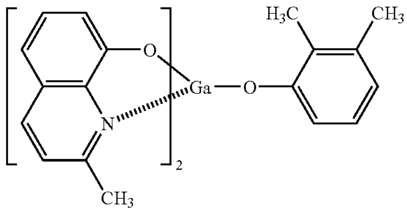
(37)
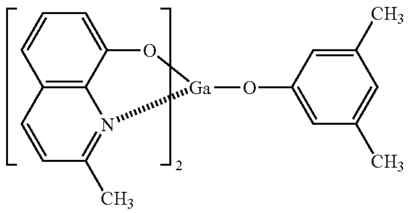
(38)
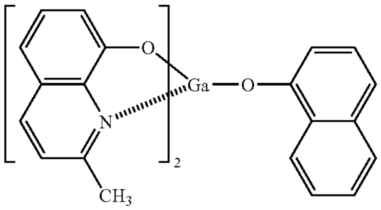
(39)
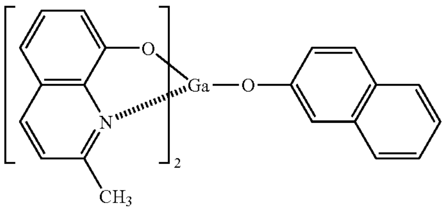

-continued
(40)
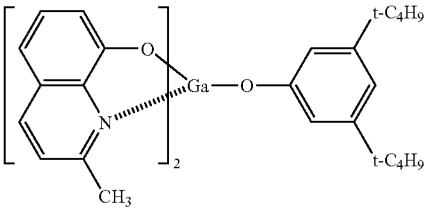
(41)
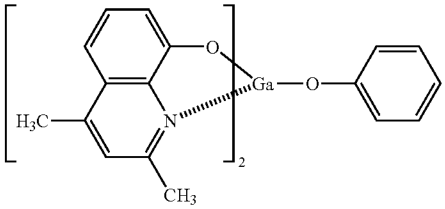
(42)
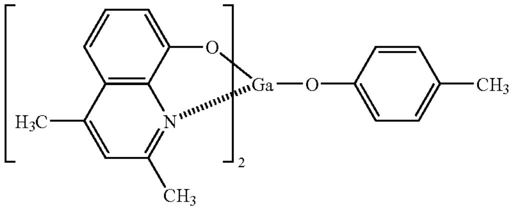
(43)
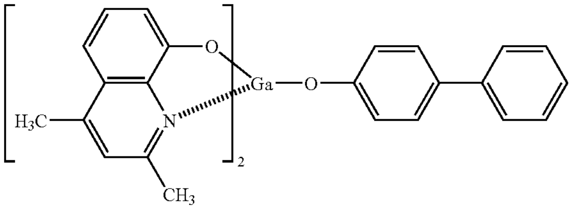
(44)
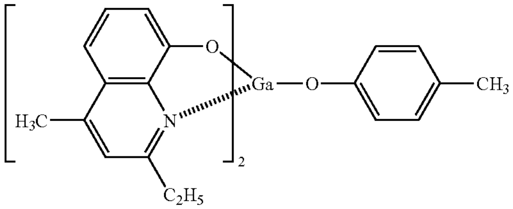
(45)
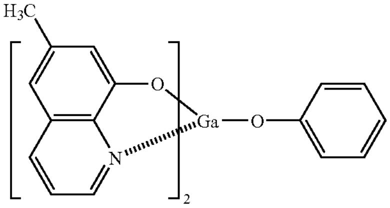
(46)
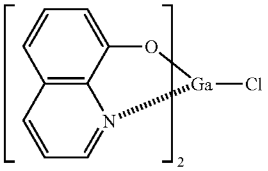
-continued
(47)
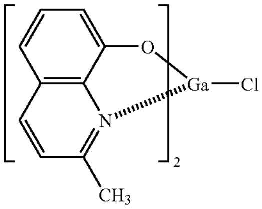
(48)
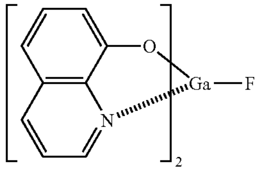
(49)
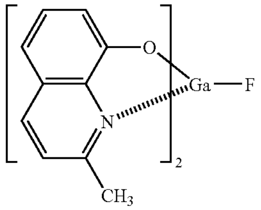
(50)
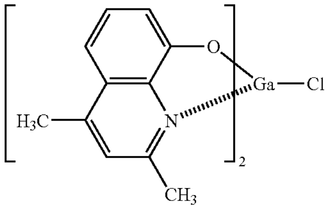
(51)
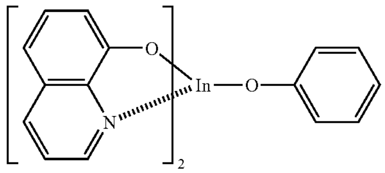
(52)
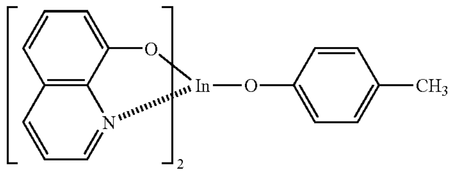
(53)
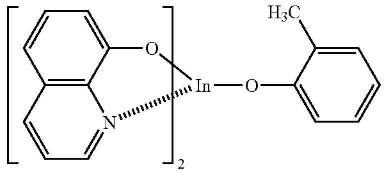
(54)
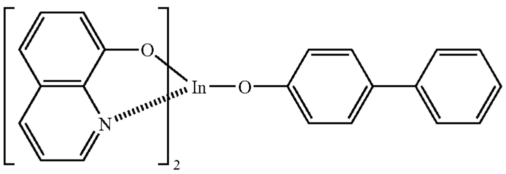

-continued (55)

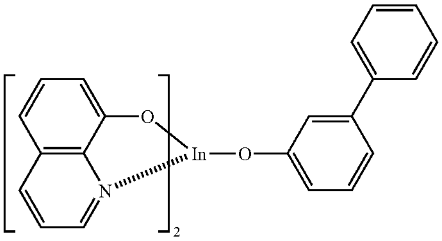

As the metal complex in the present invention, metal complexes of Nos. 1, 4, 9, 16, 18, 26, 29, 31, 34, 41, 43, 51 and 54 are more preferable and metal complexes of Nos. 4, 9, 18, 29, 34, 43 and 54 are particularly preferable.

The electron transporting material in the present invention has an electron mobility of preferably $10^{-5}$ $cm^2/V \cdot s$ or more, and more preferably $2 \times 10^{-5}$ $cm^2$ $/V \cdot s$ or more.

The electron mobility of the electron transporting material in the present invention may be found by a Time of Flight (TOF) method, and as the electron mobility in the present invention, values found by the TOF method are adopted.

The thickness of the mixture layer is preferably in a range from 0.1 nm to 20 nm, and more preferably in a range from 0.5 nm to 15 nm.

As the hole transporting material to be used in the mixture layer of the electron transporting material and hole transporting material, conventionally known hole transporting materials may be used. The hole transporting material to be used in the present invention is preferably a compound selected from the hole transporting materials described in the explanations of the aforementioned hole transport layer and hole injection layer.

The hole transporting material used in the mixture layer in a particularly preferable embodiment of the present invention is H-1, H-2, H-4, H-5, H-7, H-11, H-17 or H-22.

The hole transporting material to be used in the mixture layer in the present invention has an hole mobility of preferably $10^{-4}$ $cm^2/V \cdot s$ or more, and more preferably $2.0 \times 10^{-4}$ $cm^2/V \cdot s$ or more.

The hole mobility of the hole transporting material in the present invention may be found by a Time of Flight (TOF) method, and as the hole mobility in the present invention, values found by the TOF method are adopted.

The electron mobility of the mixture layer of an electron transporting material and a hole transporting material is preferably higher than that of the hole transport layer, and more preferably at least ten times larger than that of the hole transport layer.

(Electron Injection Layer and Electron-Transport Layer)

The electron injection layer and the electron-transport layer are layers having any of functions for injecting electrons from the cathode, transporting electrons, and becoming a barrier to positive holes which could be injected from the anode.

As a material applied for the electron-donating dopant with respect to the electron injection layer or the electron-transport layer, any material may be used as long as it has an electron-donating property and a property for reducing an organic compound, and alkaline metals such as Li, alkaline earth metals such as Mg, and transition metals including rare-earth metals are preferably used.

Particularly, metals having a work function of 4.2 V or less are preferably applied, and specific examples thereof include Li, Na, K, Be, Mg, Ca, Sr, Ba, Y, Cs, La, Sm, Gd, and Yb.

These electron-donating dopants may be used alone or in a combination of two or more of them.

An applied amount of the electron-donating dopants differs dependent on the types of the materials, but it is preferably 0.1% by mass to 99% by mass with respect to an electron-transport layer material, more preferably 1.0% by mass to 80% by mass, and particularly preferably 2.0% by mass to 70% by mass. When the amount applied is less than 0.1% by mass, the efficiency of the present invention is insufficient so that it is not desirable, and when it exceeds 99% by mass, the electron transportation ability is deteriorated so that it is not preferred.

Specific examples of the materials applied for the electron injection layer and the electron-transport layer include pyridine, pyrimidine, triazine, imidazole, triazole, oxazole, oxadiazole, fluorenone, anthraquinodimethane, anthrone, diphenylquinone, thiopyrandioxide, carbodiimide, imide, fluorenylidenemethane, distyrylpyradine, fluorine-substituted aromatic compounds, naphthalene, heterocyclic tetracarboxylic anhydrides such as perylene, phthalocyanine, and the derivatives thereof (which may form condensed rings with the other rings); and metal complexes represented by metal complexes of 8-quinolinol derivatives, metal phthalocyanine, and metal complexes containing benzoxazole, or benzothiazole as the ligand.

Although a thickness of the electron injection layer and the electron-transport layer is not particularly limited, it is preferred that the thickness is in 1 nm to 5 μm, it is more preferably 5 nm to 1 μm, and it is particularly preferably 10 nm to 500 nm in view of decrease in driving voltage, improvements in luminescent efficiency, and improvements in durability.

The electron injection layer and the electron-transport layer may have either a monolayered structure comprising one or two or more of the above-mentioned materials, or a multilayer structure composed of plural layers of a homogeneous composition or a heterogeneous composition.

When the carrier transportation layer adjacent to the light-emitting layer is an electron-transport layer, it is preferred that the Ea (ETL) of the electron-transport layer is higher than the Ea (D) of the dopants contained in the light-emitting layer in view of driving durability.

For the Ea (ETL), a value measured in accordance with the same manner as the measuring method of Ea, which will be mentioned later, is used.

Furthermore, the carrier mobility in the electron-transport layer is usually from $10^{-7}$ $cm^2 \cdot V^{-1} \cdot s^{-1}$ to $10^{-1}$ $cm^2 \cdot V^{-1} \cdot s^{-1}$, and in this range, from $10^{-5}$ $cm^2 \cdot V^{-1} \cdot s^{-1}$ to $10^{-1}$ $cm^2 \cdot V^{-1} \cdot s^{-1}$ is preferable, from $10^{-4}$ $cm^2 \cdot V^{-1} \cdot s^{-1}$ to $10^{-1}$ $cm^2 \cdot V^{-1} \cdot s^{-1}$ is more preferable, and from $10^{-3}$ $cm^2 \cdot V^{-1} \cdot s^{-1}$ to $10^{-1}$ $cm^2 \cdot V^{-1} \cdot s^{-1}$ is particularly preferred, in view of luminescent efficiency.

Moreover, it is preferred that the carrier mobility in the electron-transport layer is higher than that of the light-emitting layer in view of driving durability. The carrier mobility is measured in accordance with the same method as that of the positive hole-transport layer.

As to the carrier mobility of the luminescent device of the present invention, it is preferred that the carrier mobility in the positive hole-transport layer, the electron-transport layer, and the light-emitting layer has the relationship of (electron-transport layer≧positive hole-transport layer)>light-emitting layer in view of driving durability.

As the host material contained in the buffer layer, the below-mentioned positive hole transporting host or electron transporting host may be preferably used.

(Light-Emitting Layer)

The light-emitting layer is a layer having a function for receiving positive holes from the anode, the positive hole-injection layer, the positive hole-transport layer or the positive hole transporting buffer layer, and receiving electrons from the cathode, the electron injection layer, the electron-transport layer, or the electron transporting buffer layer, and for providing a field for recombination of the positive holes with the electrons to emit a light.

The light-emitting layer of the present invention contains at least one type of luminescent dopant and a plurality of host compounds.

The light-emitting layer may be composed of either one layer or two or more layers wherein the respective layers may emit light of different colors from one another in the respective layers. Even if the light-emitting layers are composed of a plurality thereof, it is preferred that each of the light-emitting layers contains at least one luminescent dopant and a plurality of host compounds.

The luminescent dopant and the plural host compounds contained in the light-emitting layer of the present invention may be either a combination of a fluorescence luminescent dopant in which the luminescence (fluorescence) from a singlet exciton is obtained and the plurality of host compounds, or a combination of a phosphorescence luminescent dopant in which the luminescence (phosphorescence) from triplet exciton is obtained and the plurality of host compounds; among these, a combination of the phosphorescence luminescent dopant and the plurality of host compounds is preferable in view of luminescent efficiency.

The light-emitting layer of the present invention may contain two or more types of luminescent dopants for improving color purity and expanding the luminescent wavelength region.

<<Luminescent Dopant>>

Any of phosphorescent emission materials, fluorescent emission materials and the like may be used as the luminescent dopant in the present invention.

It is preferred that the luminescent dopant in the present invention is one satisfying a relationship between the above-described host compound and the luminescent dopant of 1.2 eV>ΔIp>0.2 eV and/or 1.2 eV>ΔEa>0.2 eV in view of driving durability.

<<Phosphorescence Luminescent Dopant>>

Examples of the above-described phosphorescence luminescent dopant generally include complexes containing transition metal atoms or lantanoid atoms.

For instance, although the transition metal atoms are not limited, they are preferably ruthenium, rhodium, palladium, tungsten, rhenium, osmium, iridium, or platinum; more preferably rhenium, iridium, and platinum, or even more preferably iridium, or platinum.

Examples of the lantanoid atoms include lanthanum, cerium, praseodymium, neodymium, samarium, europium, gadolinium, terbium, dysprosium, holmium, erbium, thulium, ytterbium, and lutetium, and among these lantanoid atoms, neodymium, europium, and gadolinium are preferred.

Examples of ligands in the complex include the ligands described, for example, in "Comprehensive Coordination Chemistry" authored by G. Wilkinson et al., published by Pergamon Press Company in 1987; "Photochemistry and Photophysics of Coordination compounds" authored by H. Yersin, published by Springer-Verlag Company in 1987; and "YUHKI KINZOKU KAGAKU—KISO TO OUYOU—(Metalorganic Chemistry—Fundamental and Application—)" authored by Akio Yamamoto, published by Shokabo Publishing Co., Ltd. in 1982.

Specific examples of the ligands include preferably halogen ligands (preferably chlorine ligands), aromatic carboxycyclic ligands (e.g., cyclopentadienyl anions, benzene anions, or naphthyl anions and the like), nitrogen-containing heterocyclic ligands (e.g., phenylpyridine, benzoquinoline, quinolinol, bipyridyl, or phenanthroline and the like), diketone ligands (e.g., acetylacetone and the like), carboxylic acid ligands (e.g., acetic acid ligands and the like), alcoholate ligands (e.g., phenolate ligands and the like), carbon monoxide ligands, isonitryl ligands, and cyano ligand, and more preferably nitrogen-containing heterocyclic ligands.

The above-described complexes may be either a complex containing one transition metal atom in the compound, or a so-called polynuclear complex containing two or more transition metal atoms wherein different metal atoms may be contained at the same time.

Among these, specific examples of the luminescent dopants include phosphorescence luminescent compounds described in patent documents such as U.S. Pat. No. 6,303,238B1, U.S. Pat. No. 6,097,147, WO00/57676, WO00/70655, WO01/08230, WO01/39234A2, WO01/41512A1, WO02/02714A2, WO02/15645A1, WO02/44189A1, JP-A No. 2001-247859, Japanese Patent Application No. 2000-33561, JP-A Nos. 2002-117978, 2002-225352, and 2002-235076, Japanese Patent Application No. 2001-239281, JP-A No. 2002-170684, EP1211257, JP-A Nos. 2002-226495, 2002-234894, 2001-247859, 2001-298470, 2002-173674, 2002-203678, 2002-203679, and 2004-357791, Japanese Patent Application Nos. 2005-75340 and 2005-75341, etc. Among these, more preferable examples of the luminescent dopants include Ir complexes, Pt complexes, Cu complexes, Re complexes, W complexes, Rh complexes, Ru complexes, Pd complexes, Os complexes, Eu complexes, Tb complexes, Gd complexes, Dy complexes, and Ce complexes; particularly preferable are Ir complexes, Pt complexes, and Re complexes; and among these, Ir complexes, Pt complexes, and Re complexes each containing at least one coordination mode of metal-carbon bonds, metal-nitrogen bonds, metal-oxygen bonds, and metal-sulfur bonds are preferred.

<<Fluorescence Luminescent Dopant>>

Examples of the above-described fluorescence luminescent dopants generally include benzoxazole, benzoimidazole, benzothiazole, styrylbenzene, polyphenyl, diphenylbutadiene, tetraphenylbutadiene, naphthalimide, coumarin, pyran, perinone, oxadiazole, aldazine, pyralidine, cyclopentadiene, bis-styrylanthracene, quinacridone, pyrrolopyridine, thiadiazolopyridine, cyclopentadiene, styrylamine, aromatic dimethylidene compounds, condensed polyaromatic compounds (anthracene, phenanthroline, pyrene, perylene, rubrene, pentacene and the like), a variety of metal complexes represented by metal complexes of 8-quinolynol, pyromethene complexes or rare-earth complexes, polymer compounds such as polythiophene, polyphenylene or polyphenylenevinylene, organic silanes, and derivatives thereof.

Among these, specific examples of the luminescent dopants include the following compounds, but it should be noted that the present invention is not limited thereto.

D-1
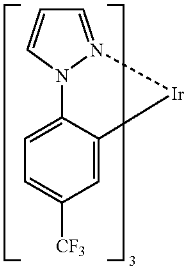
D-2
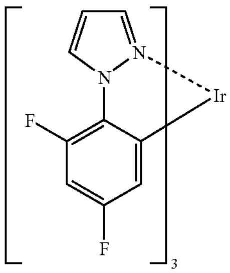
D-3
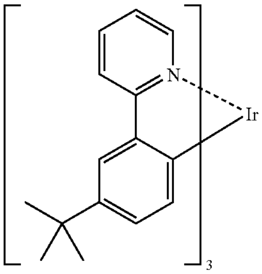
D-4
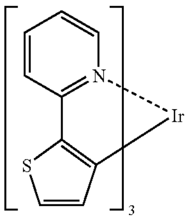
D-5
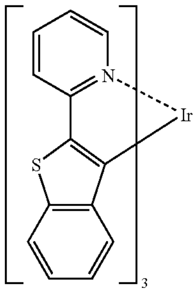
-continued
D-6
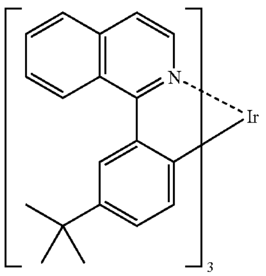
D-7
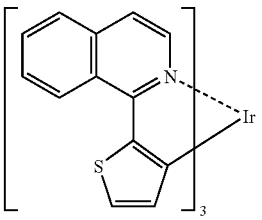
D-8
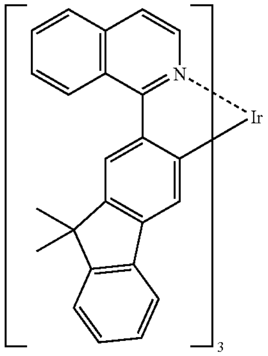
D-9
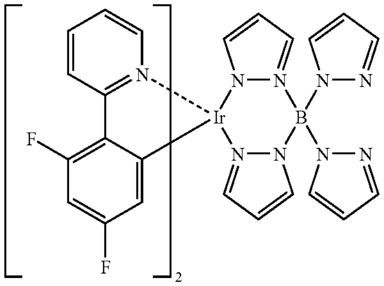
D-10
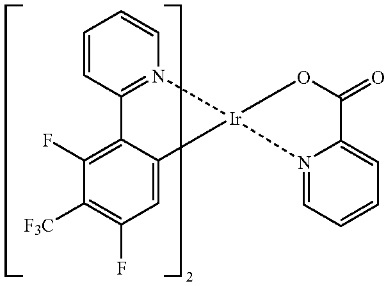

-continued
D-11
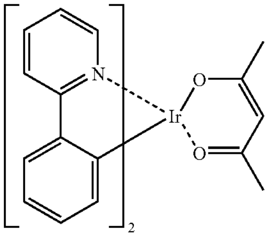
D-12
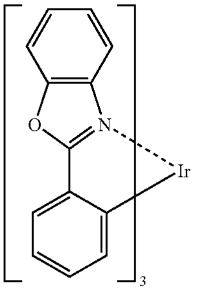
D-13
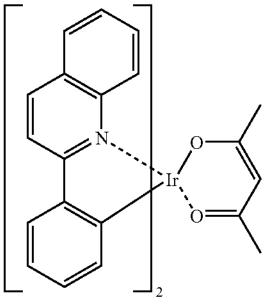
D-14
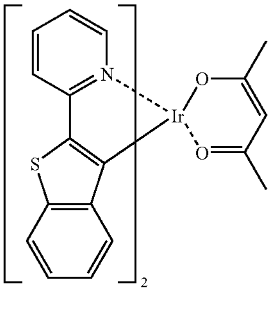
D-15
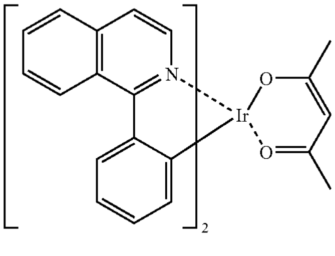
-continued
D-16
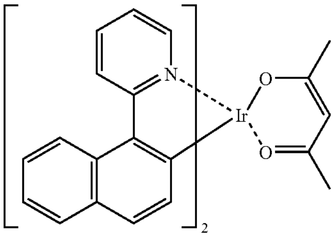
D-17
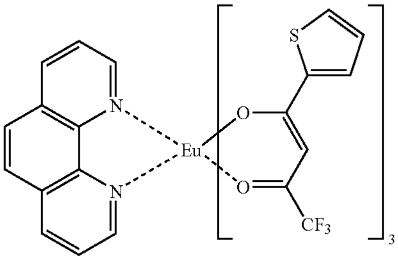
D-18
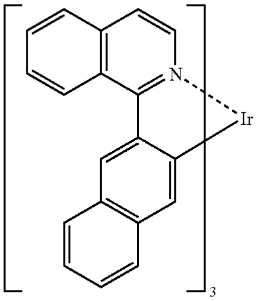
D-19
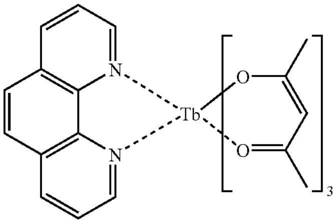
D-20
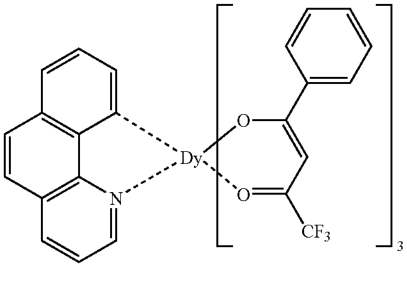
D-21
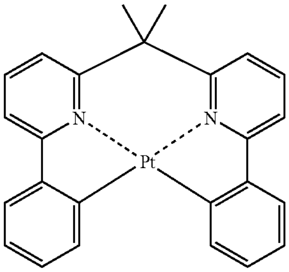

-continued

D-22

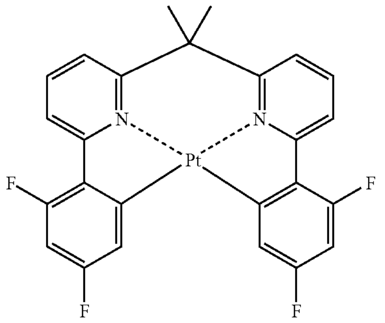

D-23

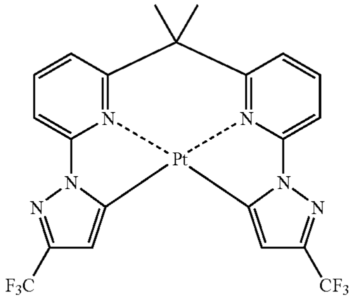

D-24

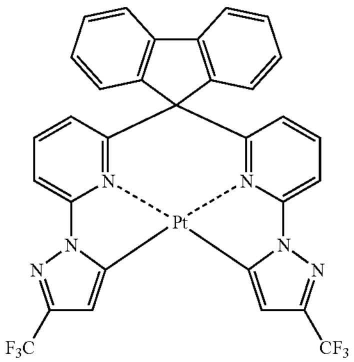

Among the above-described compounds, as the luminescent dopants to be used according to the present invention, D-2, D-3, D-4, D-5, D-6, D-7, D-8, D-9, D-10, D-11, D-12, D-13, D-14, D-15, D-16, D-21, D-22, D-23, or D-24 is preferable, D-2, D-3, D-4, D-5, D-6, D-7, D-8, D-12, D-14, D-15, D-16, D-21, D-22, D-23, or D-24 is more preferable, and D-21, D-22, D-23, or D-24 is further preferable in view of luminescent efficiency, and durability.

The luminescent dopant in a light-emitting layer is contained in an amount of 0.1% by mass to 30% by mass with respect to the total mass of the compounds generally forming the light-emitting layer, but it is preferably contained in an amount of 1% by mass to 15% by mass, and more preferably in an amount of 2% by mass to 12% by mass in view of durability and luminescent durability.

Although a thickness of the light-emitting layer is not particularly limited, 1 nm to 500 nm is usually preferred, and within this range, 5 nm to 200 nm is more preferable, and 5 nm to 100 nm is further preferred in view of luminescent efficiency.

(Host Material)

As the host materials to be used according to the present invention, positive hole transporting host materials excellent in positive hole transporting property (referred to as a "positive hole transporting host" in some cases) and electron transporting host compounds excellent in electron transporting property (referred to as an "electron transporting host" in some cases) may be used.

<<Positive Hole Transporting Host>>

The positive hole transporting host used for the organic layer of the present invention preferably has an ionization potential Ip of 5.1 eV to 6.3 eV, more preferably has an ionization potential of 5.4 eV to 6.1 eV, and further preferably has an ionization potential of 5.6 eV to 5.8 eV in view of improvements in durability and decrease in driving voltage. Furthermore, it preferably has an electron affinity Ea of 1.2 eV to 3.1 eV, more preferably of 1.4 eV to 3.0 eV, and further preferably of 1.8 eV to 2.8 eV in view of improvements in durability and decrease in driving voltage.

Specific examples of such positive hole transporting hosts as mentioned above include pyrrole, carbazole, triazole, oxazole, oxadiazole, pyrazole, imidazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, electroconductive high-molecular oligomers such as thiophene oligomers, polythiophenes and the like, organic silanes, carbon films, derivatives thereof, and the like.

Among these, carbazole derivatives, aromatic tertiary amine compounds, and thiophene derivatives are preferable, and particularly, compounds containing a plurality of carbazole skeletons and/or aromatic tertiary amine skeletons in a molecule are preferred.

As specific examples of the positive hole transporting hosts described above, the following compounds may be listed, but the present invention is not limited thereto.

H-1

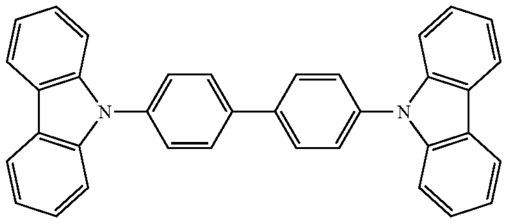

H-2

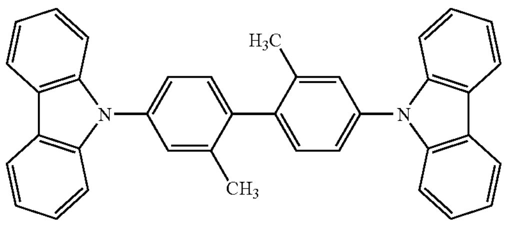

-continued
H-3
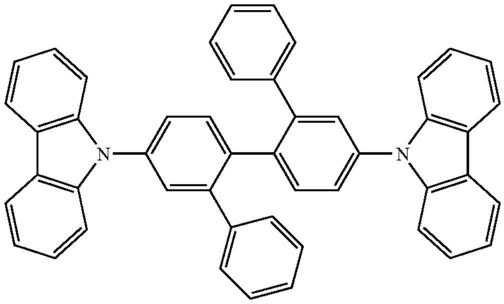
H-4
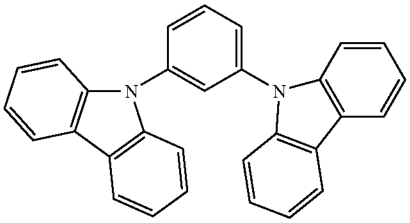
H-5
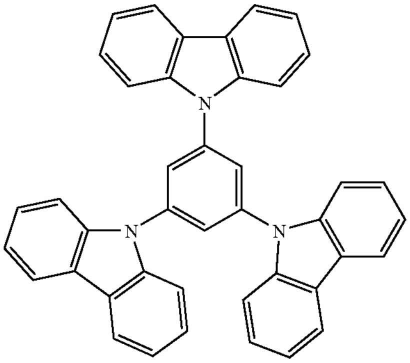
H-6
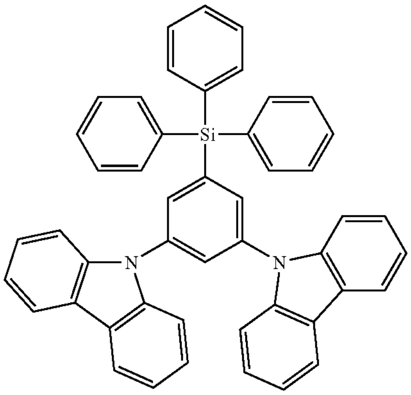
-continued
H-7
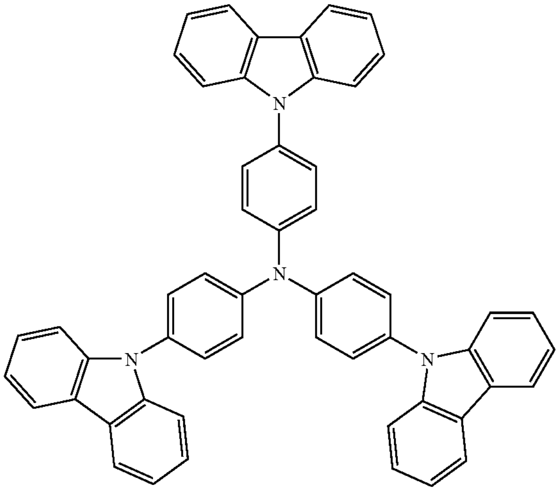
H-8
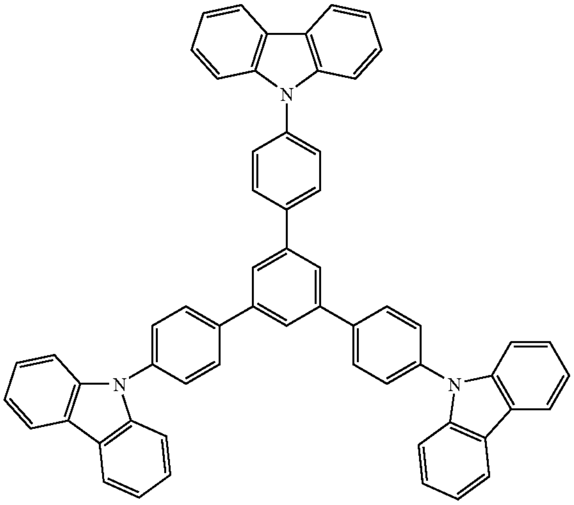
H-9
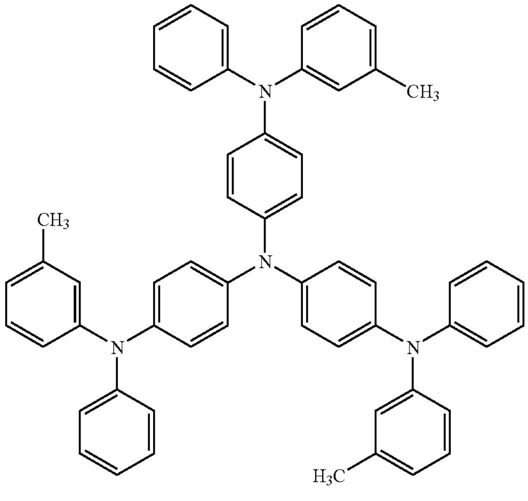

-continued
H-10
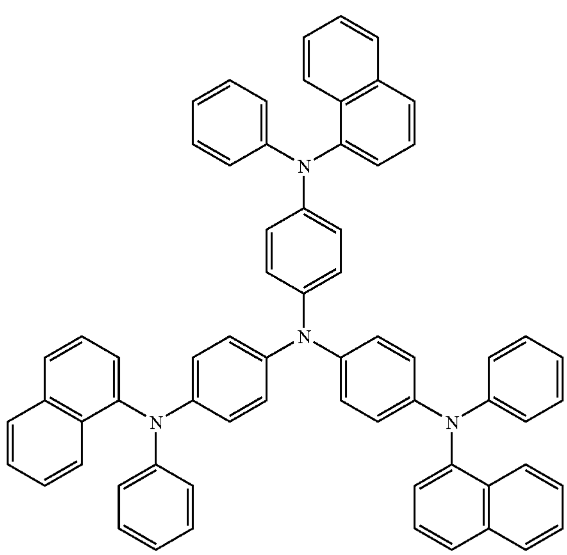
H-11
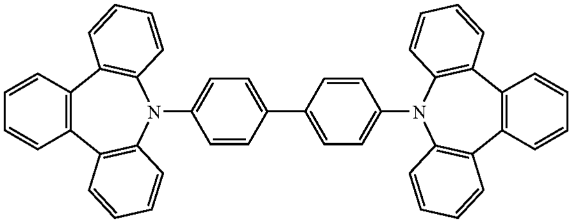
H-12
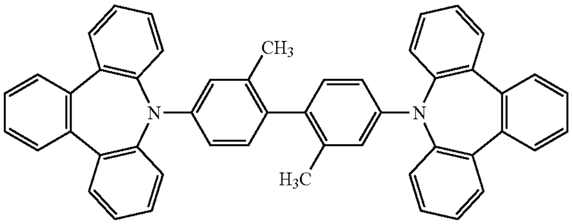
H-13
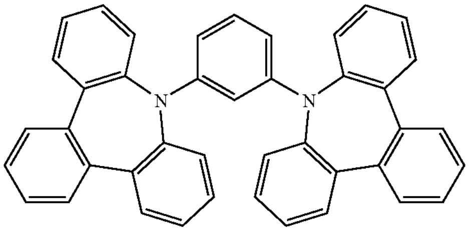
-continued
H-14
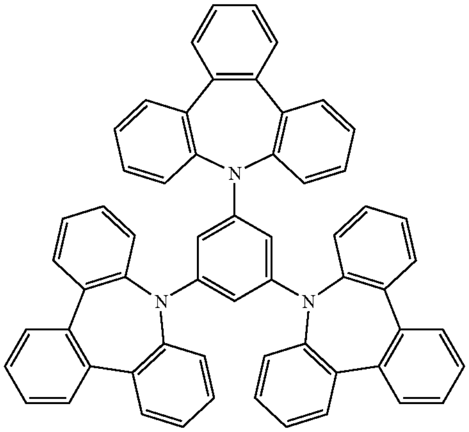
H-15
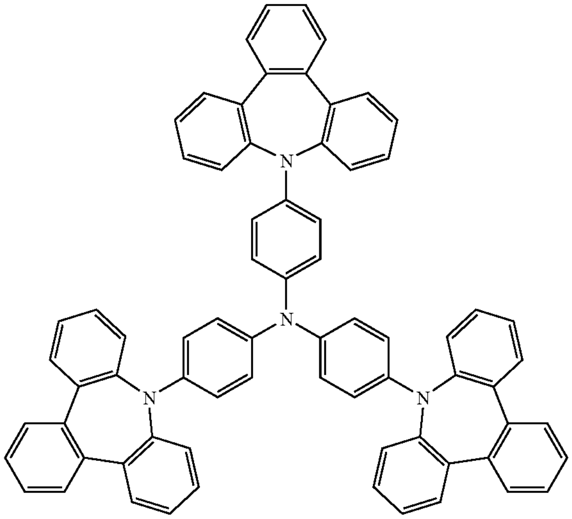
H-16
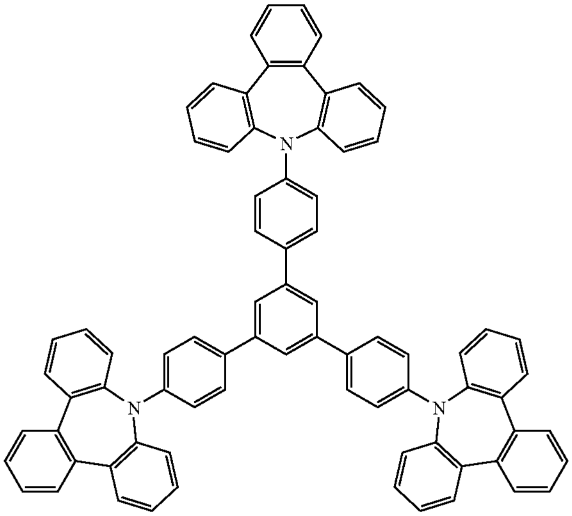

-continued
H-17
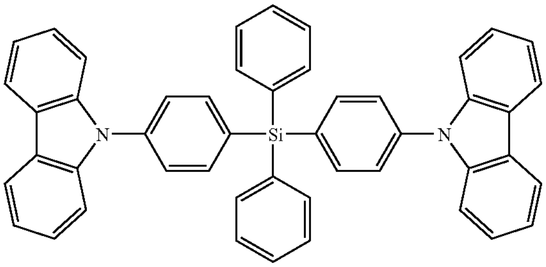
H-18
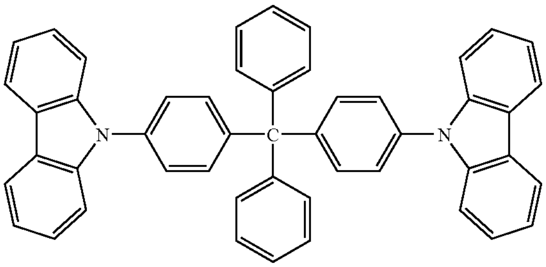
H-19
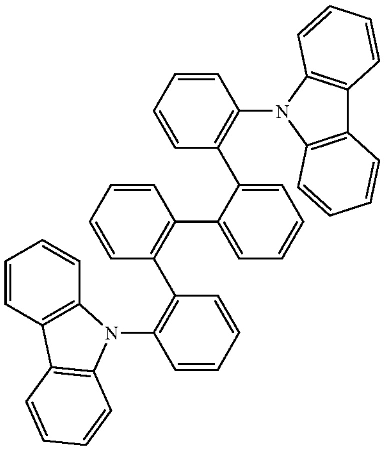
H-20
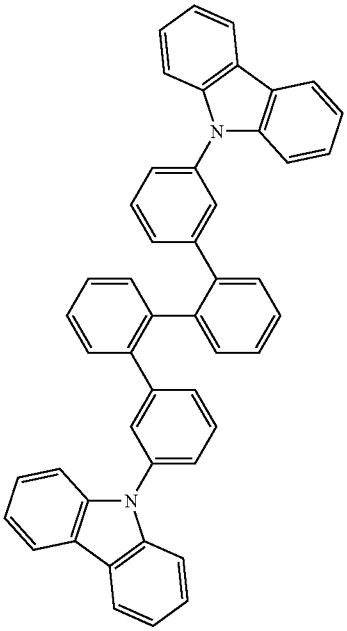
-continued
H-21
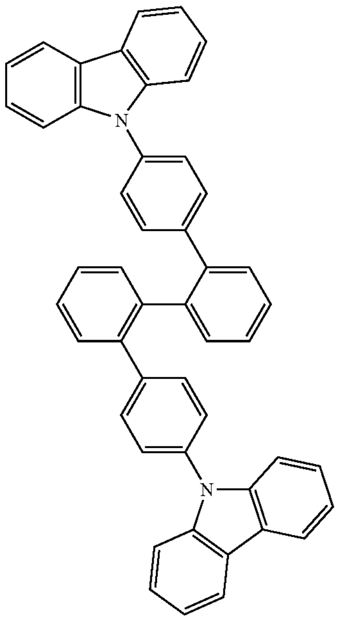
H-22
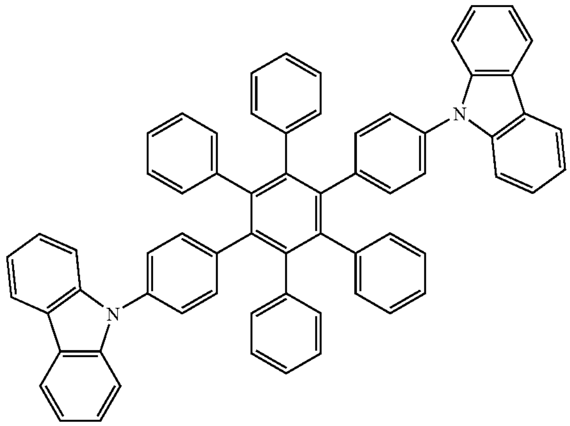
H-23
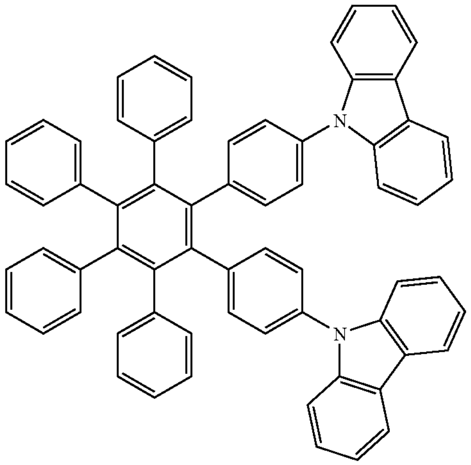
<<Electron Transporting Host>>
As the electron transporting host used according to the present invention, it is preferred that an electron affinity Ea of the host is 2.5 eV to 3.5 eV, more preferably 2.6 eV to 3.2 eV, and further preferably 2.8 eV to 3.1 eV in view of improvements in durability and decrease in driving voltage. Furthermore, it is preferred that an ionization potential Ip of the host is 5.7 eV to 7.5 eV, more preferably 5.8 eV to 7.0 eV, and further preferably 5.9 eV to 5.8 eV in view of improvements in durability and decrease in driving voltage.

Specific examples of such electron transporting hosts as mentioned above include pyridine, pyrimidine, triazine, imidazole, pyrazole, triazole, oxazole, oxadiazole, fluorenone, anthraquinonedimethane, anthrone, diphenylquinone, thiopyrandioxide, carbodiimide, fluorenylidenemethane, distyrylpyradine, fluorine-substituted aromatic compounds, heterocyclic tetracarboxylic anhydrides such as naphthaleneperylene and the like, phthalocyanine, derivatives thereof (which may form a condensed ring with another ring), and a variety of metal complexes represented by metal complexes of 8-quinolynol derivatives, metal phthalocyanine, and metal complexes having benzoxazole or benzothiazole as the ligand.

Preferable electron transporting hosts are metal complexes, azole derivatives (benzimidazole derivatives, imidazopyridine derivatives and the like), and azine derivatives (pyridine derivatives, pyrimidine derivatives, triazine derivatives and the like). Among these, metal complexes are preferred according to the present invention in view of durability. As the metal complex compound, a metal complex containing a ligand having at least one nitrogen atom, oxygen atom, or sulfur atom to be coordinated with the metal is more preferable.

Although a metal ion in the metal complex is not particularly limited, a beryllium ion, a magnesium ion, an aluminum ion, a gallium ion, a zinc ion, an indium ion, a tin ion, a platinum ion, or a palladium ion is preferred; more preferable is a beryllium ion, an aluminum ion, a gallium ion, a zinc ion, a platinum ion, or a palladium ion; and further preferable is an aluminum ion, a zinc ion, or a palladium ion.

Although there are a variety of well-known ligands to be contained in the above-described metal complexes, examples thereof include ligands described in "Photochemistry and Photophysics of Coordination Compounds" authored by H. Yersin, published by Springer-Verlag Company in 1987; "YUHKI KINZOKU KAGAKU—KISO TO OUYOU—(Metalorganic Chemistry—Fundamental and Application—)" authored by Akio Yamamoto, published by Shokabo Publishing Co., Ltd. in 1982, and the like.

The ligands are preferably nitrogen-containing heterocyclic ligands (having preferably 1 to 30 carbon atoms, more preferably 2 to 20 carbon atoms, and particularly preferably 3 to 15 carbon atoms); and they may be a unidentate ligand or a bi- or higher-dentate ligand. Preferable are bi- to hexa-dentate ligands, and mixed ligands of bi- to hexa-dentate ligands with a unidentate ligand are also preferable.

Examples of the ligands include azine ligands (e.g. pyridine ligands, bipyridyl ligands, terpyridine ligands and the like); hydroxyphenylazole ligands (e.g. hydroxyphenylbenzimidazole ligands, hydroxyphenylbenzoxazole ligands, hydroxyphenylimidazole ligands, hydroxyphenylimidazopyridine ligands and the like); alkoxy ligands (those having preferably 1 to 30 carbon atoms, more preferably 1 to 20 carbon atoms, and particularly preferably 1 to 10 carbon atoms, examples of which include methoxy, ethoxy, butoxy, 2-ethylhexyloxy and the like); aryloxy ligands (those having preferably 6 to 30 carbon atoms, more preferably 6 to 20 carbon atoms, and particularly preferably 6 to 12 carbon atoms, examples of which include phenyloxy, 1-naphthyloxy, 2-naphthyloxy, 2,4,6-trimethylphenyloxy, 4-biphenyloxy and the like); heteroaryloxy ligands (those having preferably 1 to 30 carbon atoms, more preferably 1 to 20 carbon atoms, and particularly preferably 1 to 12 carbon atoms, examples of which include pyridyloxy, pyrazyloxy, pyrimidyloxy, quinolyloxy and the like); alkylthio ligands (those having preferably 1 to 30 carbon atoms, more preferably 1 to 20 carbon atoms, and particularly preferably 1 to 12 carbon atoms, examples of which include methylthio, ethylthio and the like); arylthio ligands (those having preferably 6 to 30 carbon atoms, more preferably 6 to 20 carbon atoms, and particularly preferably 6 to 12 carbon atoms, examples of which include phenylthio and the like); heteroarylthio ligands (those having preferably 1 to 30 carbon atoms, more preferably 1 to 20 carbon atoms, and particularly preferably 1 to 12 carbon atoms, examples of which include pyridylthio, 2-benzimidazolylthio, benzooxazolylthio, 2-benzothiazolylthio and the like); siloxy ligands (those having preferably 1 to 30 carbon atoms, more preferably 3 to 25 carbon atoms, and particularly preferably 6 to 20 carbon atoms, examples of which include a triphenylsiloxy group, a triethoxysiloxy group, a triisopropylsiloxy group and the like); aromatic hydrocarbon anion ligands (those having preferably 6 to 30 carbon atoms, more preferably 6 to 25 carbon atoms, and particularly preferably 6 to 20 carbon atoms, examples of which include a phenyl anion, a naphthyl anion, an anthranyl anion and the like anion); aromatic heterocyclic anion ligands (those having preferably 1 to 30 carbon atoms, more preferably 2 to 25 carbon atoms, and particularly preferably 2 to 20 carbon atoms, examples of which include a pyrrole anion, a pyrazole anion, a triazole anion, an oxazole anion, a benzoxazole anion, a thiazole anion, a benzothiazole anion, a thiophene anion, a benzothiophene anion and the like); indolenine anion ligands and the like. Among these, nitrogen-containing heterocyclic ligands, aryloxy ligands, heteroaryloxy groups, aromatic hydrocarbon anion ligands, aromatic heterocyclic anion ligands or siloxy ligands are preferable, and nitrogen-containing heterocyclic ligands, aryloxy ligands, siloxy ligands, aromatic hydrocarbon anion ligands, or aromatic heterocyclic anion ligands are more preferable.

Examples of the metal complex electron transporting hosts include compounds described, for example, in Japanese Patent Application Laid-Open Nos. 2002-235076, 2004-214179, 2004-221062, 2004-221065, 2004-221068, 2004-327313 and the like.

Specific examples of these electron transporting hosts include the following materials, but it should be noted that the present invention is not limited thereto.

E-1

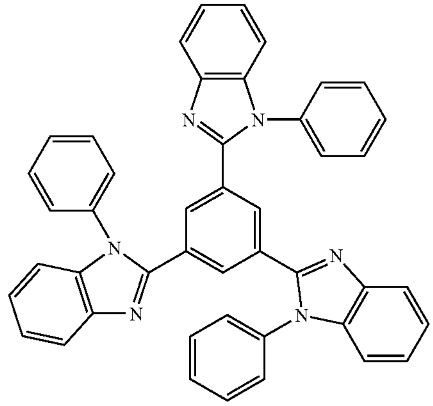

-continued
E-2
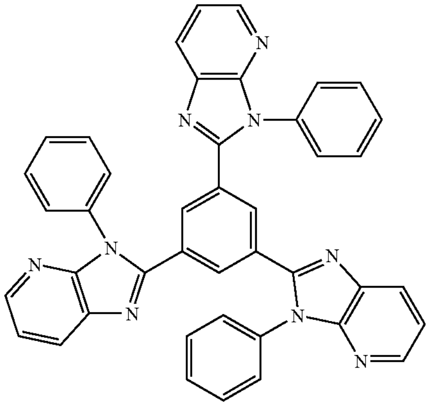
E-3
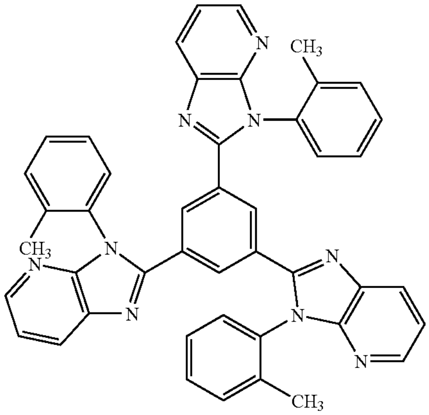
E-4
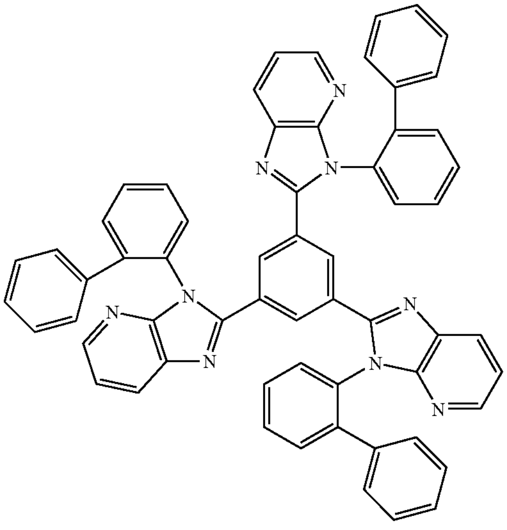
-continued
E-5
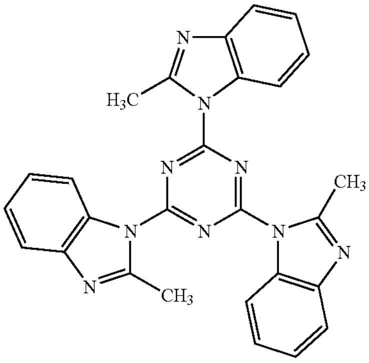
E-6
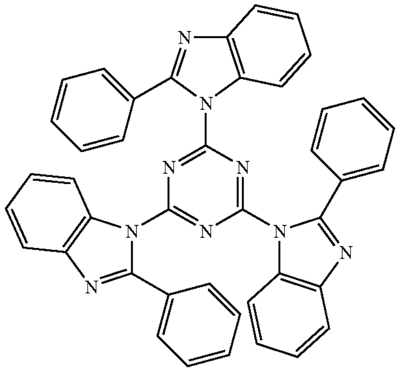
E-7
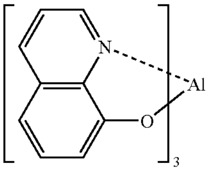
E-8
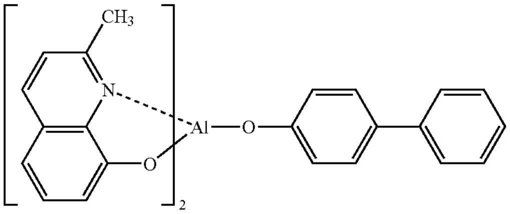
E-9
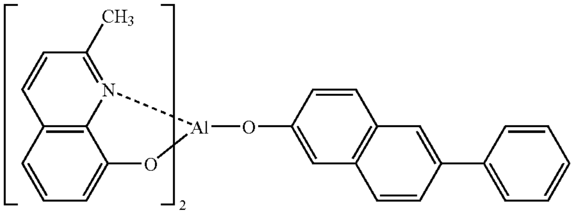

-continued
E-10
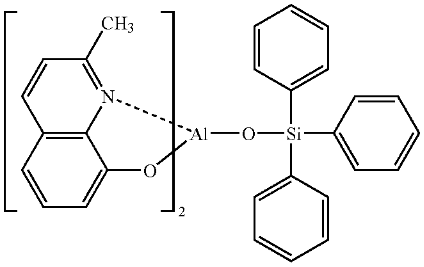
E-11
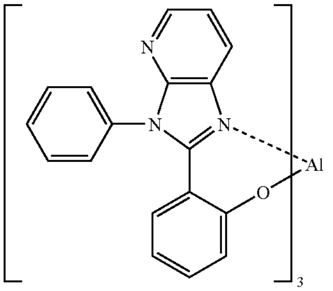
E-12
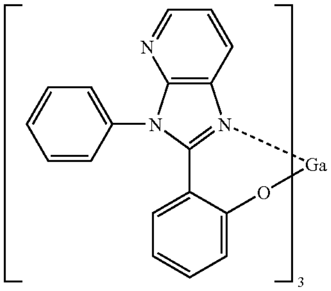
E-13
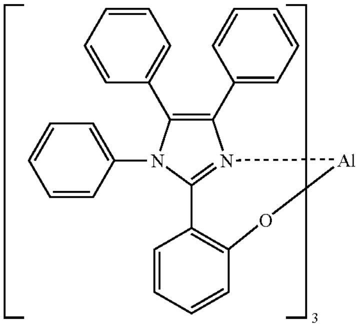
E-14
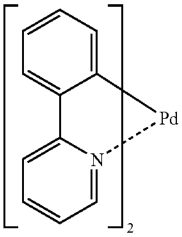
-continued
E-15
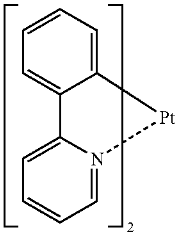
E-16
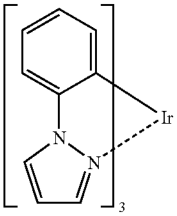
E-17
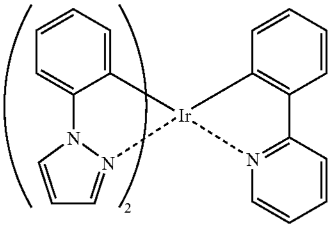
E-18
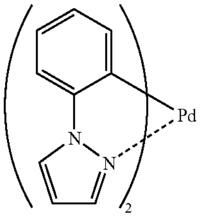
E-19
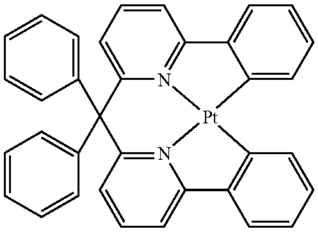
E-20
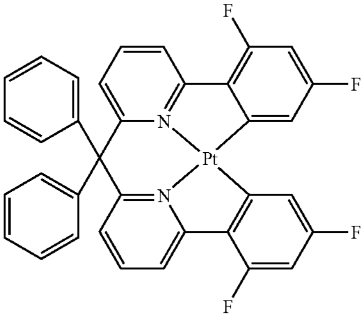

-continued

E-21

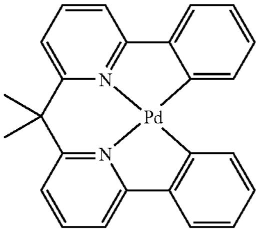

E-22

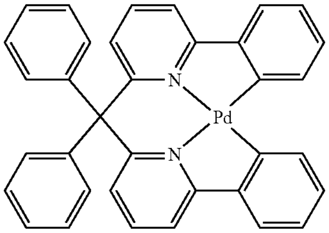

As the electron transportation hosts, E-1 to E-6, E-8, E-9, E-10, E-21, or E-22 is preferred, E-3, E-4, E-6, E-8, E-9, E-10, E-21, or E-22 is more preferred, and E-3, E-4, E-21, or E-22 is further preferred.

In the light-emitting layer of the present invention, it is preferred that when a phosphorescence luminescent dopant is used as the luminescent dopant, the lowest triplet excitation energy T1(D) in the phosphorescence luminescent dopant and the minimum value among the lowest triplet excitation energies T1(H) min in the plural host compounds satisfy the relationship of T1(H) min>T1(D) in view of color purity, luminescent efficiency, and driving durability.

Although a content of the host compounds according to the present invention is not particularly limited, it is preferably 15% by mass to 85% by mass with respect to the total mass of the compounds forming the light-emitting layer in view of luminescence efficiency and driving voltage.

A carrier mobility in the light-emitting layer is generally from $10^{-7}$ $cm^2 \cdot V^{-1} \cdot s^{-1}$ to $10^{-1}$ $cm^2 \cdot V^{-1} \cdot s^{-1}$, and within this range, it is preferably from $10^{-6}$ $cm^2 \cdot V^{-1} \cdot s^{-1}$ to $10^{-1}$ $cm^2 \cdot V^{-1} \cdot s^{-1}$, further preferably, from $10^{-5}$ $cm^2 \cdot V^{-1} \cdot s^{-1}$ to $10^{-1}$ $cm^2 \cdot V^{-1} \cdot s^{-1}$, and particularly preferably, from $10^{-4}$ $cm^2 \cdot V^{-1} \cdot s^{-1}$ to $10^{-1}$ $cm^2 \cdot V^{-1} \cdot s^{-1}$ in view of luminescence efficiency.

It is preferred that the carrier mobility of the light-emitting layer is lower than that of the carrier transportation layer, which will be mentioned herein below, in view of luminescence efficiency and driving durability.

The carrier mobility is measured in accordance with the "Time of Flight" method, and the resulting value is determined to be the carrier mobility.

(Positive Hole-Blocking Layer)

A positive hole-blocking layer is a layer having a function to prevent the positive holes transported from the anode to the light-emitting layer from passing through to the cathode side. According to the present invention, a positive hole-blocking layer may be provided as an organic compound layer adjacent to the light-emitting layer on the cathode side.

The positive hole-blocking layer is not particularly limited, but specifically, it may contain an aluminum complex such as BAlq, a triazole derivative, a pyrazabol derivative or the like.

It is preferred that a thickness of the positive hole-blocking layer is generally 50 nm or less in order to lower the driving voltage, more preferably it is 1 nm to 50 nm, and further preferably it is 5 nm to 40 nm.

(Anode)

The anode may generally be any material as long as it has a function as an electrode for supplying positive holes to the organic compound layer, and there is no particular limitation as to the shape, the structure, the size or the like. However, it may be suitably selected from among well-known electrode materials according to the application and purpose of luminescent device. As mentioned above, the anode is usually provided as a transparent anode.

Materials for the anode may preferably include, for example, metals, alloys, metal oxides, electroconductive compounds, and mixtures thereof, and those having a work function of 4.0 eV or more are preferred. Specific examples of the anode materials include electroconductive metal oxides such as tin oxides doped with antimony, fluorine or the like (ATO and FTO), tin oxide, zinc oxide, indium oxide, indium tin oxide (ITO), and indium zinc oxide (IZO); metals such as gold, silver, chromium, and nickel; mixtures or laminates of these metals and the electroconductive metal oxides; inorganic electroconductive materials such as copper iodide and copper sulfide; organic electroconductive materials such as polyaniline, polythiophene, and polypyrrole; and laminates of these inorganic or organic electron-conductive materials with ITO. Among these, the electroconductive metal oxides are preferred, and particularly, ITO is preferable in view of productivity, high electroconductivity, transparency and the like.

The anode may be formed on the substrate in accordance with a method which is appropriately selected from among wet methods such as printing methods, coating methods and the like; physical methods such as vacuum deposition methods, sputtering methods, ion plating methods and the like; and chemical methods such as CVD and plasma CVD methods and the like, in consideration of the suitability to a material constituting the anode. For instance, when ITO is selected as a material for the anode, the anode may be formed in accordance with a DC or high-frequency sputtering method, a vacuum deposition method, an ion plating method or the like.

In the organic electroluminescence device of the present invention, a position at which the anode is to be formed is not particularly limited, but it may be suitably selected according to the application and purpose of the luminescent device. The anode may be formed on either the whole surface or a part of the surface on either side of the substrate.

For patterning to form the anode, a chemical etching method such as photolithography, a physical etching method such as etching by laser, a method of vacuum deposition or sputtering through superposing masks, or a lift-off method or a printing method may be applied.

A thickness of the anode may be suitably selected according to the material constituting the anode and is therefore not definitely decided, but it is usually in the range of around 10 nm to 50 μm, and preferably 50 nm to 20 μm.

A value of resistance of the anode is preferably $10^3$ Ω/□ or less, and $10^2$ Ω/□ or less is more preferable. In the case where the anode is transparent, it may be either transparent and colorless, or transparent and colored. For extracting luminescence from the transparent anode side, it is preferred that a light transmittance of the anode is 60% or higher, and more preferably 70% or higher.

Concerning transparent anodes, there is a detailed description in "TOUMEI DENNKYOKU-MAKU NO SHINTENKAI (Novel Developments in Transparent Electrode Films)" edited by Yutaka Sawada, published by C.M.C. in 1999, the contents of which are incorporated by reference herein. In the case where a plastic substrate having a low heat resistance is applied, it is preferred that ITO or IZO is used to obtain a transparent anode prepared by forming the film at a low temperature of 150° C. or lower.

(Cathode)

The cathode may generally be any material as long as it has a function as an electrode for injecting electrons to the organic compound layer, and there is no particular limitation as to the shape, the structure, the size or the like. However it may be suitably selected from among well-known electrode materials according to the application and purpose of the luminescent device.

Materials constituting the cathode may include, for example, metals, alloys, metal oxides, electroconductive compounds, and mixtures thereof, and materials having a work function of 4.5 eV or less are preferred. Specific examples thereof include alkali metals (e.g., Li, Na, K, Cs or the like), alkaline earth metals (e.g., Mg, Ca or the like), gold, silver, lead, aluminum, sodium-potassium alloys, lithium-aluminum alloys, magnesium-silver alloys, rare earth metals such as indium, and ytterbium, and the like. They may be used alone, but it is preferred that two or more of them are used in combination from the viewpoint of satisfying both stability and electron injectability.

Among these, as the materials for constituting the cathode, alkaline metals or alkaline earth metals are preferred in view of electron injectability, and materials containing aluminum as a major component are preferred in view of excellent preservation stability.

The term "material containing aluminum as a major component" refers to a material constituted by aluminum alone; alloys comprising aluminum and 0.01% by mass to 10% by mass of an alkaline metal or an alkaline earth metal; or the mixtures thereof (e.g., lithium-aluminum alloys, magnesium-aluminum alloys and the like).

Regarding materials for the cathode, they are described in detail in JP-A Nos. 2-15595 and 5-121172, of which are incorporated by reference herein.

A method for forming the cathode is not particularly limited, but it may be formed in accordance with a well-known method.

For instance, the cathode may be formed in accordance with a method which is appropriately selected from among wet methods such as printing methods, coating methods and the like; physical methods such as vacuum deposition methods, sputtering methods, ion plating methods and the like; and chemical methods such as CVD and plasma CVD methods and the like, in consideration of the suitability to a material constituting the cathode. For example, when a metal (or metals) is (are) selected as a material (or materials) for the cathode, one or two or more of them may be applied at the same time or sequentially in accordance with a sputtering method or the like.

For patterning to form the cathode, a chemical etching method such as photolithography, a physical etching method such as etching by laser, a method of vacuum deposition or sputtering through superposing masks, or a lift-off method or a printing method may be applied.

In the present invention, a position at which the cathode is to be formed is not particularly limited, and it may be formed on either the whole or a part of the organic compound layer.

Furthermore, a dielectric material layer made of fluorides, oxides or the like of an alkaline metal or an alkaline earth metal may be inserted in between the cathode and the organic compound layer with a thickness of 0.1 nm to 5 nm. The dielectric layer may be considered to be a kind of electron injection layer. The dielectric material layer may be formed in accordance with, for example, a vacuum deposition method, a sputtering method, an ion-plating method or the like.

A thickness of the cathode may be suitably selected according to materials for constituting the cathode and is therefore not definitely decided, but it is usually in the range of around 10 nm to 5 μm, and preferably 50 nm to 1 μm.

Moreover, the cathode may be transparent or opaque. The transparent cathode may be formed by preparing a material for the cathode with a small thickness of 1 nm to 10 nm, and further laminating a transparent electroconductive material such as ITO or IZO thereon.

(Substrate)

According to the present invention, a substrate may be applied. The substrate to be applied is preferably one which does not scatter or attenuate light emitted from the organic compound layer. Specific examples of materials for the substrate include zirconia-stabilized yttrium (YSZ); inorganic materials such as glass; polyesters such as polyethylene terephthalate, polybutylene phthalate, and polyethylene naphthalate; and organic materials such as polystyrene, polycarbonate, polyethersulfon, polyarylate, polyimide, polycycloolefin, norbornene resin, poly(chlorotrifluoroethylene), and the like.

For instance, when glass is used as the substrate, non-alkali glass is preferably used with respect to the quality of material in order to decrease ions eluted from the glass. In the case of employing soda-lime glass, it is preferred to use glass on which a barrier coat such as silica has been applied. In the case of employing an organic material, it is preferred to use a material excellent in heat resistance, dimension stability, solvent resistance, electrical insulation, and workability.

There is no particular limitation as to the shape, the structure, the size or the like of the substrate, but it may be suitably selected according to the application, purposes and the like of the luminescent device. In general, a plate-like substrate is preferred as the shape of the substrate. A structure of the substrate may be a monolayer structure or a laminated structure. Furthermore, the substrate may be formed from a single member or two or more members.

Although the substrate may be in a transparent and colorless, or a transparent and colored condition, it is preferred that the substrate is transparent and colorless from the viewpoint that the substrate does not scatter or attenuate light emitted from the organic light-emitting layer.

A moisture permeation preventive layer (gas barrier layer) may be provided on the front surface or the back surface of the substrate.

For a material of the moisture permeation preventive layer (gas barrier layer), inorganic substances such as silicon nitride and silicon oxide may be preferably applied. The moisture permeation preventive layer (gas barrier layer) may be formed in accordance with, for example, a high-frequency sputtering method or the like.

In the case of applying a thermoplastic substrate, a hard-coat layer or an under-coat layer may be further provided as needed.

(Protective Layer)

According to the present invention, the whole organic EL device may be protected by a protective layer.

A material contained in the protective layer may be one having a function to prevent penetration of substances such as moisture and oxygen, which accelerate deterioration of the device, into the device.

Specific examples thereof include metals such as In, Sn, Pb, Au, Cu, Ag, Al, Ti, Ni and the like; metal oxides such as MgO, SiO, $SiO_2$, $Al_2O_3$, GeO, NiO, CaO, BaO, $Fe_2O_3$, $Y_2O_3$, $TiO_2$ and the like; metal nitrides such as $SiN_x$, $SiN_xO_y$, and the like; metal fluorides such as $MgF_2$, LiF, $AlF_3$, $CaF_2$ and the like; polyethylene; polypropylene; polymethyl methacrylate;

polyimide; polyurea; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one comonomer; fluorine-containing copolymers each having a cyclic structure in the copolymerization main chain; water-absorbing materials each having a coefficient of water absorption of 1% or more; moisture permeation preventive substances each having a coefficient of water absorption of 0.1% or less; and the like.

There is no particular limitation as to a method for forming the protective layer. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

(Sealing)

The whole organic electroluminescence device of the present invention may be sealed with a sealing cap.

Furthermore, a moisture absorbent or an inert liquid may be used to seal a space defined between the sealing cap and the luminescent device. Although the moisture absorbent is not particularly limited. Specific examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, magnesium oxide and the like. Although the inert liquid is not particularly limited, specific examples thereof include paraffins; liquid paraffins; fluorine-based solvents such as perfluoroalkanes, perfluoroamines, perfluoroethers and the like; chlorine-based solvents; silicone oils; and the like.

In the organic electroluminescence device of the present invention, when a DC (AC components may be contained as needed) voltage (usually 2 volts to 15 volts) or DC is applied across the anode and the cathode, luminescence can be obtained.

The driving durability of the organic electroluminescence device according to the present invention can be determined based on the brightness halftime at a specified brightness. For instance, the brightness halftime may be determined by using a source measure unit, model 2400, manufactured by KEITHLEY to apply a DC voltage to the organic EL device to cause it to emit light, conducting a continuous driving test under the condition that the initial brightness is 2000 cd/$m^2$, defining the time required for the brightness to reach 1000 cd/$m^2$ as the brightness halftime T(½), and then comparing the resulting brightness halftime with that of a conventional luminescent device. According to the present invention, the numerical value thus obtained was used.

An important characteristic parameter of the organic electroluminescence device of the present invention is external quantum efficiency. The external quantum efficiency is calculated by "the external quantum efficiency (ϕ)=the number of photons emitted from the device/the number of electrons injected to the device", and it may be said that the larger the value obtained is, the more advantageous the device is in view of electric power consumption.

Moreover, the external quantum efficiency of the organic electroluminescence device is decided by "the external quantum efficiency (ϕ)=the internal quantum efficiency×light-extraction efficiency". In an organic EL device which utilizes the fluorescent luminescence from the organic compound, an upper limit of the internal quantum efficiency is 25%, while the light-extraction efficiency is about 20%, and accordingly, it is considered that an upper limit of the external quantum efficiency is about 5%.

From the standpoint of reducing power consumption and increasing driving durability, the external quantum efficiency of a device is preferably 6% or more, and particularly preferably 12% or more.

As the numerical value of the external quantum efficiency, the maximum value thereof when the device is driven at 20° C., or a value of the external quantum efficiency at about 100 cd/$m^2$ to 300 cd/$m^2$ (preferably 200 cd/$m^2$) when the device is driven at 20° C. may be used.

According to the present invention, a value obtained by the following method is used. Namely, a DC constant voltage is applied to the EL device by the use of a source measure unit, model 2400, manufactured by Toyo TECHNICA Corporation to cause it to emit light, the brightness of the light is measured by using a brightness photometer (trade name: BM-8, manufactured by Topcon Corporation), and then, the external quantum efficiency at 200 cd/$m^2$ is calculated.

Further, an external quantum efficiency of the luminescent device may be obtained by measuring the luminescent brightness, the luminescent spectrum, and the current density, and calculating the external quantum efficiency from these results and a specific visibility curve. In other words, using the current density value, the number of electrons injected can be calculated. By an integration calculation using the luminescent spectrum and the specific visibility curve (spectrum), the luminescent brightness can be converted into the number of photons emitted. From the result, the external quantum efficiency (%) can be calculated by "(the number of photons emitted/the number of electrons injected to the device)×100".

For the driving method of the organic electroluminescence device of the present invention, driving methods described in JP-A Nos. 2-148687, 6-301355, 5-29080, 7-134558, 8-234685, and 8-241047; Japanese Patent No. 2784615, U.S. Pat. Nos. 5,828,429 and 6,023,308 are applicable.

(Application of the Organic Electroluminescence Device of the Present Invention)

The organic electroluminescence device of the present invention can be appropriately used for indicating elements, displays, backlights, electronic photographs, illumination light sources, recording light sources, exposure light sources, reading light sources, signages, advertising displays, interior accessories, optical communications and the like.

EXAMPLES

In the following, examples of the organic electroluminescence device of the present invention will be described, however it should be noted that the present invention is not restricted to these examples.

Example 1

1. Production of an Organic EL Device

<<Production of an Organic EL Device 1 According to the Present Invention>>

An ITO glass substrate (manufactured by Geomatic (k.k.), surface resistance: 10 Ω/□) which had a thickness of 0.5 mm and was 2.5 by 2.5 cm square was placed in a washing container and subjected to ultrasonic cleaning in 2-propanol and then to UV-ozone treatment carried out for 30 minutes. The following layers were vapor deposited on this transparent anode by a vacuum vapor deposition method. The vapor deposition speed in the following examples of the present invention is 0.2 nm/sec unless otherwise noted. The vapor deposition speed was measured using a quarts resonator. The film thicknesses mentioned below were also measured using the quartz resonator.

(Hole Injection Layer)

2-TNATA and F4-TCNQ (tetrafluorotetracyanoquinodimethane) were co-deposited such that the deposition rate of 2-TNATA was 0.5 nm/sec and the amount of F4-TCNQ was 0.3% by weight based on 2-TNATA. The film thickness was designed to be 55 nm.

(Hole Transport Layer)

α-NPD was deposited on the hole injection layer in a thickness of 10 nm at a deposition rate of 0.5 nm/sec.

(Mixture Layer of an Electron Transporting Material and a Hole Transporting Material)

50.0% by weight of CBP and 50.0% by weight of BAlq were co-deposited on the hole injection layer at a deposition rate of 0.1 nm/sec to form a mixture layer 10 nm in thickness.

(Light-Emitting Layer)

Alq and rubrene were co-deposited such that the amount of rubrene was 2.0% by weight based on Alq. The film thickness of the light-emitting layer was designed to be 20 nm.

A patterned mask (mask having a luminous region of 2 mm×2 mm) was disposed above the light-emitting layer and lithium fluoride was deposited in a thickness of 1 nm at a deposition rate of 0.1 nm/sec to form an electron injection layer. A metal aluminum was deposited in a thickness of 100 nm to form a cathode.

The produced laminate was placed in a glove box in which the atmosphere was substituted with argon gas and sealed using a stainless sealing can and a ultraviolet ray-curable type adhesive (trade name: XNR5516HV, manufactured by Nagase Ciba) to produce an organic EL device 1.

<<Production of an Organic EL Device 2 According to the Present Invention>>

In the organic EL device 1, the light-emitting layer was altered to that shown in the following and the following electron transport layer was disposed between the light-emitting layer and the electron injection layer.

Light-emitting layer: CBP and Irppy were co-deposited such that the amount of Irppy was 5.0% by weight based on CBP. The film thickness was designed to be 30 nm.

Electron transport layer: Alq was deposited in a film thickness of 30 nm.

<<Production of an Organic EL Device 3 According to the Present Invention>>

In the organic EL device 2, the light-emitting layer was altered to that shown in the following.

Light-emitting layer: MCP and a blue light emission material were co-deposited such that the amount of the blue light emission material was 5.0% by weight based on CBP. The film thickness was designed to be 30 nm.

<<Production of a Device A of Comparative Example>

A device A of comparative example was prepared in the same manner as in the production of the organic EL device 1 without the mixture layer of the electron transporting material and the hole transporting material.

<<Production of a Device B of Comparative Example>

A device B of comparative example was prepared in the same manner as in the production of the organic EL device 2 without the mixture layer of the electron transporting material and the hole transporting material.

<<Production of a Device C of Comparative Example>

A device C of comparative example was prepared in the same manner as in the production of the organic EL device 2 without the mixture layer of the electron transporting material and the hole transporting material and except that a mixture layer of α-NPD and a star burst compound was formed as the hole transport layer.

Hole transport layer: co-deposition layer of A-NPD and a star burst compound represented by the following formula having an amount of 10% by weight based on α-NPD. The film thickness was designed to be 10 nm.

<<Production of a Device D of Comparative Example>

A device D of comparative example was prepared in the same manner as in the production of the organic EL device 3 without the mixture layer of the electron transporting material and the hole transporting material.

The structure of the compound to be used in the above luminescence device is shown below.

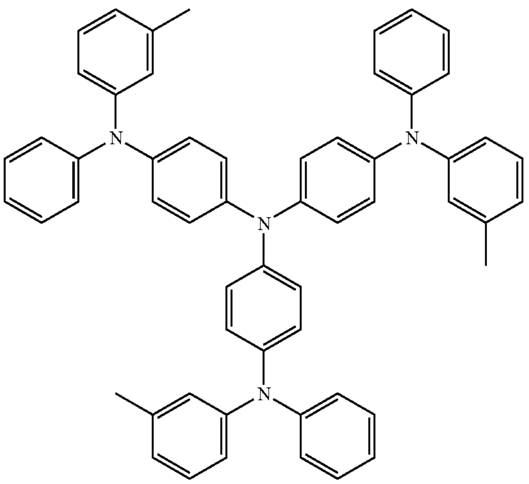

Star Burst Compound

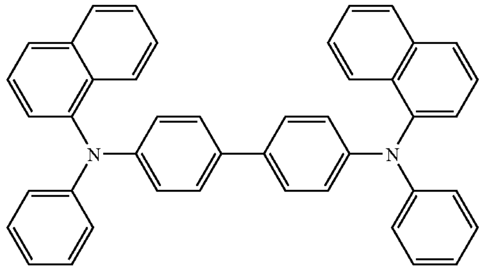

α-NPD

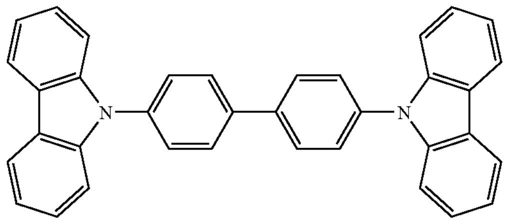

CBP

-continued

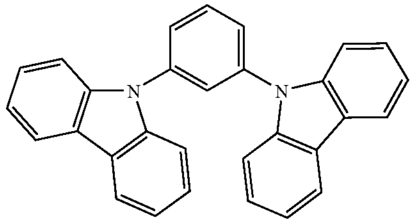

MCP

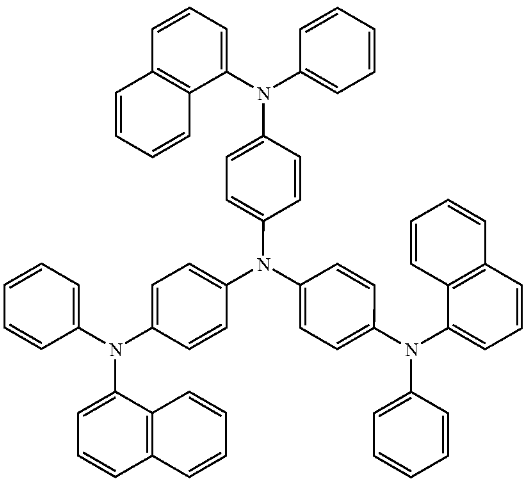

2-TNATA

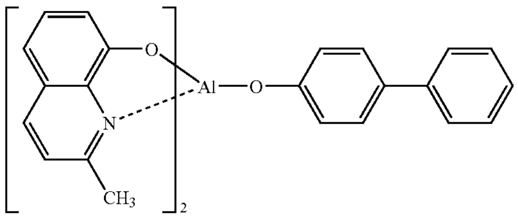

BAlq

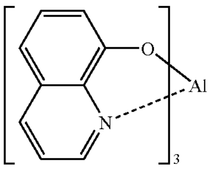

Alq

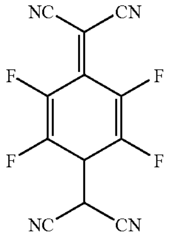

F4-TCNQ

-continued

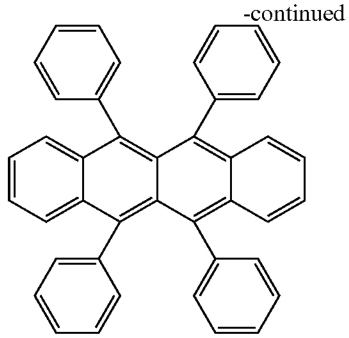

Rubrene

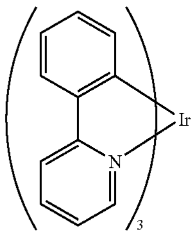

Irppy

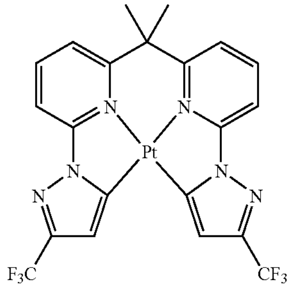

Blue light emission material

<Evaluation of Performance>

1. Electron Mobility

The electron mobility of the electron transporting material was found by a Time of Flight (TOF) method.

2. Evaluation of the Organic Electroluminescence Device

Each organic electroluminescence device obtained above was evaluated in the following method.

(1) Measurement of Light Emitting Efficiency

The produced luminescence devices were made to emit light by applying D.C. voltage by using Source Major Unit 2400-model manufactured by KEITHLEY. The emission spectrum was measured using Multi-channel Analyzer PMA-11 manufactured by Hamamatsu Photonics K.K. The luminance was measured by a luminance meter (trade name: BM-8, manufactured by Topcon) to calculate external quantum efficiency from the waveform of the emission spectrum and current/luminance (300 cd/$m^2$).

(2) Driving Durability Test

In succession, the luminescence devices were subjected to a continuous driving test in the condition that the initial luminance was fixed and the time required to halve the luminance was defined as a luminance half time T(½). The results are shown in Table 1.

(3) Driving Voltage

Using Source Major Unit 2400-model manufactured by KEITHLEY, D.C. voltage was applied to the produced luminescence device to emit light. The voltage when the luminance (measured using an luminance meter manufactured by Hamamatsu Photonics K.K.) was 300 cd/$m^2$ was measured.

The results are shown in Table 1.

TABLE 1

| Device No. | Electron Mobility in Mixture Layer of Electron Transporting Material and Hole Transporting Material | Electron Mobility in Hole Transport Layer | Driving Voltage (V) | Light Emitting Efficiency (%) | Luminance Half Time (hour) | Remarks |
|---|---|---|---|---|---|---|
| No. 1 | $2.5 \times 10^{-5}$ | $<10^{-6}$ | 8.9 | 2.1 | 2100 | Invention |
| Comparative A | — | — | 9.3 | 1.5 | 1200 | Comparative |
| No. 2 | $2.5 \times 10^{-5}$ | $<10^{-6}$ | 9.8 | 11.5 | 4700 | Invention |
| Comparative B | — | — | 10.2 | 7.3 | 2500 | Comparative |
| Comparative C | — | — | 9.7 | 9.9 | 2800 | Comparative |
| No. 3 | $2.5 \times 10^{-5}$ | $<10^{-6}$ | 11.8 | 8.6 | 3300 | Invention |
| Comparative D | — | — | 12.1 | 3.8 | 1800 | Comparative |

From the results shown in Table 1, it is found that the devices of the present invention attained high emitting efficiency and high driving durability by introducing a mixture layer of an electron transporting material and a hole transporting material between the hole transport layer and the light-emitting layer, whereas the comparative devices was reduced in luminance caused by a deterioration in material quality along with the driving of the device.

What is claimed is:

1. An organic electroluminescence device comprising at least an organic light-emitting layer between a pair of electrodes and an organic hole transport layer between the light-emitting layer and an anode of the pair of electrodes, wherein the device further comprises a mixture layer of an electron transporting material and a hole transporting material between the light-emitting layer and the hole transport layer, and the mixture layer is in direct contact with the light-emitting layer, wherein electron mobility in the mixture layer is higher than in both organic layers adjacent the mixture layer.

2. The organic electroluminescence device according to claim 1, wherein the electron transporting material contained in the mixture layer is a metal complex.

3. The organic electroluminescence device according to claim 2, wherein the metal complex is a compound represented by the following formula (1):

Formula (1)

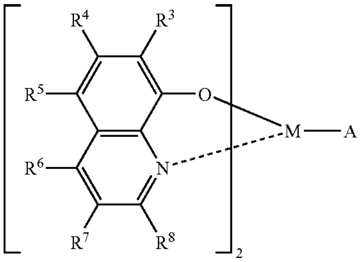

wherein M represents Al, Ga or In; $R_3$ to $R_8$ each independently represent a hydrogen atom, an alkyl group or an alkoxy group; and A represents —O-Ar in which Ar is an aryl group or a halogen atom.

4. The organic electroluminescence device according to claim 1, wherein the electron transporting material contained in the mixture layer has an electron mobility of $10^{-5}$ $cm^2/V \cdot s$ or more.

5. The organic electroluminescence device according to claim 1, wherein the electron transporting material contained in the mixture layer is a metal complex having an electron mobility of $10^{-5}$ $cm^2/V \cdot s$ or more.

6. The organic electroluminescence device according to claim 1, wherein the electron transporting material contained in the mixture layer is a compound represented by the following formula (1) and has an electron mobility of $10^{-5}$ $cm^2/V \cdot s$ or more:

Formula (1)

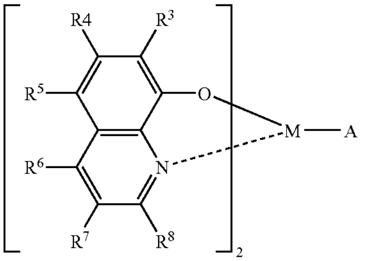

wherein M represents Al, Ga or In; $R_3$ to $R_8$ each independently represent a hydrogen atom, an alkyl group or an alkoxy group; and A represents —O-Ar in which Ar is an aryl group or a halogen atom.

7. The organic electroluminescence device according to claim 1, wherein the mixture layer has a thickness in a range from 0.1 nm to 20 nm.

8. The organic electroluminescence device according to claim 1, wherein an electron mobility in the mixture layer is higher than that in the hole transport layer.

9. The organic electroluminescence device according to claim 8, wherein the electron mobility in the mixture layer is at least ten times larger than that in the hole transport layer.

10. The organic electroluminescence device according to claim 1, wherein the light-emitting layer contains plural host materials.

11. The organic electroluminescence device according to claim 10, wherein the plural host materials include at least an electron transporting host material and a hole transporting host material.

* * * * *